(12) United States Patent
Kumamoto et al.

(10) Patent No.: US 7,847,714 B2
(45) Date of Patent: Dec. 7, 2010

(54) ΔΣ-TYPE A/D CONVERTER

(75) Inventors: Toshio Kumamoto, Tokyo (JP); Takashi Okuda, Tokyo (JP); Tatsuo Sengoku, Tokyo (JP); Akira Kitaguchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 72 days.

(21) Appl. No.: 12/411,142

(22) Filed: Mar. 25, 2009

(65) Prior Publication Data

US 2009/0267816 A1 Oct. 29, 2009

(30) Foreign Application Priority Data

Apr. 24, 2008 (JP) ............... 2008-113932

(51) Int. Cl.
*H03M 1/20* (2006.01)
(52) U.S. Cl. ...................... 341/131; 341/143
(58) Field of Classification Search ............. 341/131, 341/143
See application file for complete search history.

(56) References Cited

U.S. PATENT DOCUMENTS 5,073,777 A * 12/1991 Fukuhara et al. ............ 341/131
5,225,835 A * 7/1993 Majima et al. .............. 341/143
5,627,535 A * 5/1997 Ichimura et al. ............ 341/131
5,835,038 A * 11/1998 Nakao et al. ............... 341/131

FOREIGN PATENT DOCUMENTS

| JP | 06061863 A | * 3/1994 |
| JP | 6-120837 | 4/1994 |
| JP | 2003-163596 | 6/2003 |

OTHER PUBLICATIONS

Schreier, Richard et al., "Understanding Delta-Sigma Data Converters," IEEE Press, 2005, pp. 41-49 with English Translation.

* cited by examiner

*Primary Examiner*—Howard Williams
(74) *Attorney, Agent, or Firm*—McDermott Will & Emery LLP

(57) ABSTRACT

There is provided a technique for reducing the adverse effect of idle tones in the channels in a ΔΣ-type A/D converter including a plurality of channels for converting analog input signals into digital signals. The ΔΣ-type A/D converter includes an L channel for converting a left analog input signal into a digital signal and an R channel for converting a right analog input signal into a digital signal. Each of the L channel and the R channel includes a DC dither circuit for generating a DC addition voltage for shifting the frequency of an idle tone. In the L channel and the R channel, DC addition voltages generated by DC dither circuits are different from each other.

6 Claims, 15 Drawing Sheets

ΔΣ-TYPE A/D CONVERTER

CROSS-REFERENCE TO RELATED APPLICATIONS

The disclosure of Japanese Patent Application No. 2008-113932 filed on Apr. 24, 2008 including the specification, drawings and abstract is incorporated herein by reference in its entirety.

BACKGROUND OF THE INVENTION

The present invention relates to a ΔΣ-type A/D converter including a plurality of channels for converting analog input signals into digital signals.

Conventionally, there have been proposed various techniques concerning a ΔΣ (delta sigma)-type A/D converter. For example, Japanese Unexamined Patent Publication No. Hei 6 (1994)-120837 describes a technique for controlling a zero point in quantization noise shape with accuracy without having to consider the minimum size of the use process. Further, Japanese Unexamined Patent Publication No. 2003-163596 describes a technique for suppressing the adverse effect of an idle tone which occurs in a ΔΣ-type A/D converter by using a DC dither signal (DC addition voltage). The idle tone refers to a periodic noise signal which occurs by a feedback loop and an integrating circuit in the ΔΣ-type A/D converter in the case of no analog input signal or a minute analog input signal to the ΔΣ-type A/D converter. The idle tone is described in detail, for example, in "An Introduction to ΔΣ-type analog/digital converters" written by Richard Schreier, Gabor C. Temes, translated by Takao Waho and Akira Yasuda, published by Maruzen Co., Ltd. on Oct. 10, 2007, pp. 34-37.

SUMMARY OF THE INVENTION

In a ΔΣ-type A/D converter including a plurality of channels for converting analog input signals into digital signals such as an audio ΔΣ-type A/D converter; due to the mutual interference between the channels, simple use of the DC dither signal, that is, the DC addition voltage described in Japanese Unexamined Patent Publication No. 2003-163596 does not make it possible to sufficiently suppress the adverse effect of idle tones in the channels.

The present invention has been made in view of the above circumstance, and it is an object of the invention to provide a technique for reducing the adverse effect of idle tones in the channels in a ΔΣ-type A/D converter including a plurality of channels for converting analog input signals into digital signals.

A ΔΣ-type A/D converter according to one aspect of the invention is, for example, an audio A/D converter, and includes an L channel for converting a left first analog input signal into a digital signal and an R channel for converting a right second analog input signal into a digital signal. The L channel includes a first quantizer for quantizing a first signal, a first dither circuit, and a first integrating circuit. The first dither circuit generates a first DC addition voltage which is superimposed on a first difference signal which is a difference between a signal on a signal line for propagating the first analog input signal and a first feedback signal obtained by converting an output signal of the first quantizer into an analog signal. The first integrating circuit integrates the first difference signal having the first DC addition voltage superimposed thereon and outputs a resulting signal as the first signal. The R channel includes a second quantizer for quantizing a second signal, a second dither circuit, and a second integrating circuit. The second dither circuit generates a second DC addition voltage which is different from the first DC addition voltage and is superimposed on a second difference signal which is a difference between a signal on a signal line for propagating the second analog input signal and a second feedback signal obtained by converting an output signal of the second quantizer into an analog signal. The second integrating circuit integrates the second difference signal having the second DC addition voltage superimposed thereon and outputs a resulting signal as the second signal.

A ΔΣ-type A/D converter according to another aspect of the invention is, for example, an audio A/D converter, and includes an L channel for converting a left first analog input signal into a digital signal and an R channel for converting a right second analog input signal into a digital signal. One of the L channel and the R channel includes a first quantizer for quantizing a first signal, a dither circuit, and a first integrating circuit. The dither circuit generates a DC addition voltage which is superimposed on a first difference signal which is a difference between a signal on a signal line for propagating the first analog input signal and a first feedback signal obtained by converting an output signal of the first quantizer into an analog signal. The first integrating circuit integrates the first difference signal having the DC addition voltage superimposed thereon and outputs a resulting signal as the first signal. The other one of the L channel and the R channel includes a second quantizer for quantizing a second signal and a second integrating circuit. The second integrating circuit integrates a second difference signal which is a difference between a signal on a signal line for propagating the second analog input signal when the second analog input signal is inputted to the R channel and a second feedback signal obtained by converting an output signal of the second quantizer into an analog signal and does not have a DC addition voltage superimposed thereon and outputs a resulting signal as the second signal.

According to the ΔΣ-type A/D converter of one aspect of the invention, since the different DC addition voltages are superimposed in the L channel and the R channel, it is possible to shift the frequencies of idle tones to a frequency band higher than a desired frequency band in the L channel and the R channel. Therefore, it is possible to suppress the adverse effect of idle tones in the L channel and the R channel.

Further, according to the ΔΣ-type A/D converter of another aspect of the invention, since the DC addition voltage is superimposed in only one of the L channel and the R channel, it is possible to shift the frequencies of idle tones to a frequency band higher than a desired frequency band in the L channel and the R channel. Therefore, it is possible to suppress the adverse effect of idle tones in the L channel and the R channel.

DESCRIPTION OF THE PREFERRED EMBODIMENTS

First Embodiment

Figure 1:
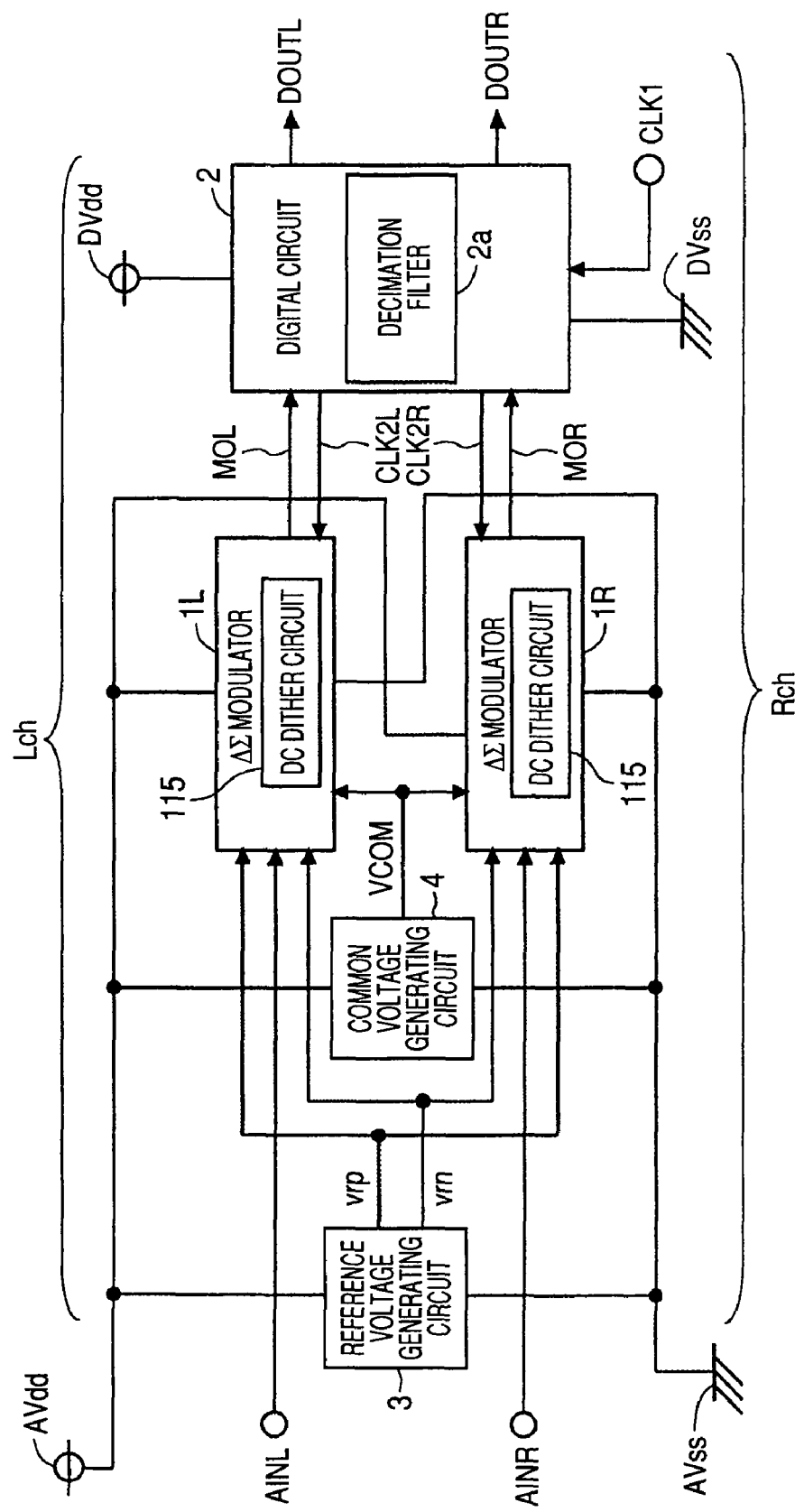
FIG. 1 is a diagram showing the configuration of a ΔΣ-type A/D converter according to a first embodiment of the present invention.

FIG. 1 is a diagram showing the configuration of a ΔΣ-type A/D converter according to a first embodiment of the present invention. The ΔΣ-type A/D converter according to the first embodiment is, for example, an oversampling-type audio A/D converter. The ΔΣ-type A/D converter according to the first embodiment and other circuits such as a CPU are formed over a single semiconductor substrate, and form a semiconductor device.

As shown in FIG. 1, the ΔΣ-type A/D converter according to the first embodiment includes an L channel Lch for converting a left analog input signal AINL into a digital signal and an R channel Rch for converting a right analog input signal AINR into a digital signal. The L channel Lch includes a ΔΣ modulator 1L, and the R channel Rch includes a ΔΣ modulator 1R. Further, the L channel Lch and the R channel Rch share a digital circuit 2, a reference voltage generating circuit 3, and a common voltage generating circuit 4.

The reference voltage generating circuit 3 generates a plus reference voltage vrp and a minus reference voltage vrn, based on a power supply voltage AVdd and a ground voltage AVss for analog circuits. Further, the reference voltage generating circuit 3 outputs the generated plus reference voltage vrp and minus reference voltage vrn to the ΔΣ modulators 1L and 1R. The common voltage generating circuit 4 generates a common voltage VCOM, based on the power supply voltage AVdd and the ground voltage AVss. Further, the common voltage generating circuit 4 outputs the generated common voltage VCOM to the ΔΣ modulators 1L and 1R.

The ΔΣ modulators 1L and 1R perform operations, based on the power supply voltage AVdd and the ground voltage AVss. The ΔΣ modulator 1L oversamples the left analog input signal AINL, based on a clock signal CLK2L for oversampling outputted from the digital circuit 2. Further, the ΔΣ modulator 1L integrates the difference between the sampled signal and an analog signal obtained by converting a digital output signal MOL of the ΔΣ modulator 1L, quantizes the integrated signal, and outputs the quantized signal as the output signal MOL.

In the same way, the ΔΣ modulator 1R oversamples the right analog input signal AINR, based on a clock signal CLK2R for oversampling outputted from the digital circuit 2. Further, the ΔΣ modulator 1R integrates the difference between the sampled signal and an analog signal obtained by converting a digital output signal MOR of the ΔΣ modulator 1R, quantizes the integrated signal, and outputs the output signal MOR.

Each of the ΔΣ modulators 1L and 1R includes a DC dither circuit 115 for generating a DC addition voltage. The DC addition voltage is used to suppress the adverse effect of idle tones which occur in the ΔΣ modulators 1L and 1R.

Each of the frequencies of the clock signals CLK2L and CLK2R for oversampling is set to, for example, 64 times the original sampling frequency fs. That is, the oversample rate of the ΔΣ modulators 1L and 1R is set to 64 times.

The digital circuit 2 operates based on a power supply voltage DVdd and a ground voltage DVss. The digital circuit 2 generates the clock signals CLK2L and CLK2R by dividing a system clock CLK1 inputted thereto, and outputs them. The digital circuit 2 includes a decimation filter 2a. The decimation filter 2a performs filtering and thinning on the output signal MOL. This reduces the sampling frequency of the analog input signal AINL to the original sampling frequency fs. Then, the decimation filter 2a serially outputs the binary-coded signal as a digital output signal DOUTL. The digital output signal DOUTL is the result of converting the left analog input signal AINL into the digital signal.

Further, the decimation filter 2a performs filtering and thinning on the output signal MOR as well. This reduces the sampling frequency of the analog input signal AINR to the original sampling frequency fs. Then, the decimation filter 2a serially outputs the binary-coded signal as a digital output signal DOUTR. The digital output signal DOUTR is the result of converting the right analog input signal AINR into the digital signal.

In the first embodiment, the power supply voltages AVdd and DVdd and the plus reference voltage vrp are set to the same positive value (e.g., +5V), and the minus reference voltage vrn is set to the same value (0V) as the ground voltages AVss and DVss. The common voltage VCOM is set to, for example, the intermediate voltage between the power supply voltage AVdd and the ground voltage AVss, that is, the intermediate voltage between the plus reference voltage vrp and the minus reference voltage vrn.

Figure 2:
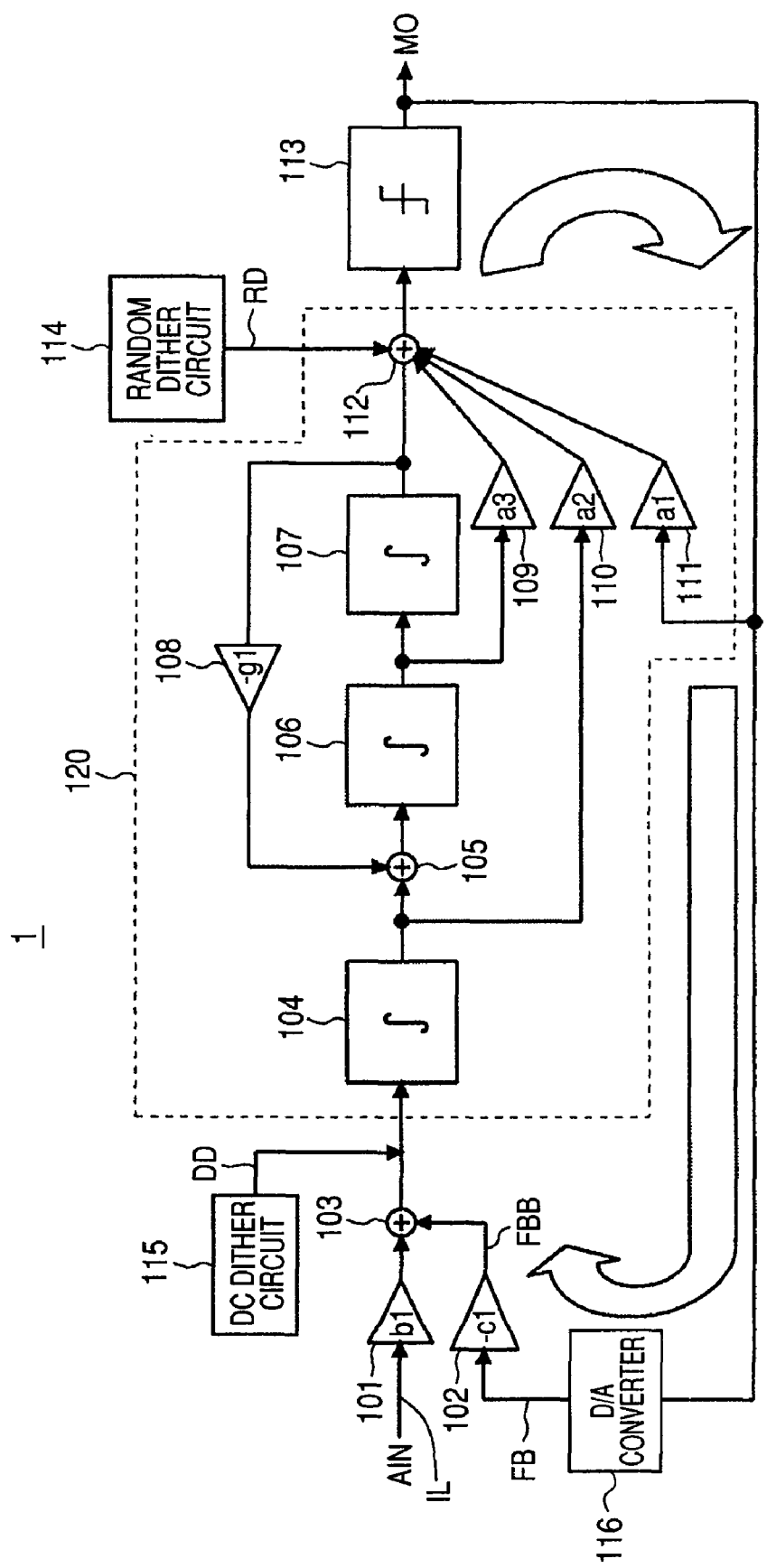
FIG. 2 is a block diagram showing the configuration of a ΔΣ modulator according to the first embodiment of the invention.

FIG. 2 is a block diagram showing a configuration example of the ΔΣ modulators 1L and 1R. In the first embodiment, the configurations of the ΔΣ modulators 1L and 1R are identical to each other. Hereinafter, the ΔΣ modulators 1L and 1R are collectively called a "ΔΣ modulator 1"; the analog input signals AINL and AINR, "analog input signal AIN"; the output signals MOL and MOR, "output signal MO"; and the clock signals CLK2L and CLK2R, "clock signal CLK2".

As shown in FIG. 2, each ΔΣ modulator 1 in the L channel Lch and the R channel Rch is, for example, a third-order modulator, and includes gain stages 101 and 102, an adder 103, an integrating circuit 120, a quantizer 113, a random dither circuit 114, a DC dither circuit 115, and a D/A converter 116. In the first embodiment, the adverse effect of an idle tone which occurs in the ΔΣ modulator 1 is suppressed by using a random dither RD outputted from the random dither circuit 114 and a DC addition voltage DD outputted from the DC dither circuit 115.

The gain stage 101 increases the level of a signal on an input line IL to which the analog input signal AIN is inputted, by b1 times (b1: positive value), and outputs the resulting signal. The gain stage 102 increases the signal level of a feedback signal FB outputted from the D/A converter 116 by −c1 times (c1: positive value), and outputs the resulting signal as an inverted feedback signal FBB. The adder 103 adds the output signal of the gain stage 101 and the inverted feedback signal FBB outputted from the gain stage 102, and outputs the resulting signal. That is, the difference signal between the output signal of the gain stage 101 and the feedback signal FB is outputted from the adder 103. In the case where the analog input signal AIN is inputted to the input line IL, the difference signal between the analog input signal AIN and the feedback signal FB is outputted from the adder 103.

The signal line from the input line IL to the adder 103 is a signal line for propagating the analog input signal AIN when the analog input signal AIN is inputted to the L channel Lch or the R channel Rch. Therefore, when the analog input signal AIN is inputted to the L channel Lch or the R channel Rch, the difference signal between the signal on the signal line for propagating the analog input signal AIN and the feedback signal FB is obtained at the adder 103.

The DC dither circuit 115 generates the DC addition voltage DD and superimposes it on the difference signal obtained by the adder 103. The integrating circuit 120 includes three integrators 104, 106, and 107, adders 105 and 112, and gain stages 108 to 111. The integrating circuit 120 integrates the difference signal obtained by the adder 103 (or more accurately, the difference signal having the DC addition voltage DD superimposed thereon), and outputs the resulting signal.

The integrator 104 integrates the signal obtained by superimposing the DC addition voltage DD on the difference signal obtained by the adder 103, and outputs the resulting signal. The adder 105 adds the output signal of the integrator 104 and the output signal of the gain stage 108, and outputs the resulting signal. The integrator 106 integrates the output signal of the adder 105, and outputs the resulting signal. The integrator 107 integrates the output signal of the integrator 106, and outputs the resulting signal. The gain stage 108 increases the signal level of the output signal of the integrator 107 by −g1 times (g1: positive value), and outputs the resulting signal. The gain stage 109 increases the signal level of the output signal of the integrator 106 by a3 times (a3: positive value), and outputs the resulting signal. The gain stage 110 increases the signal level of the output signal of the integrator 104 by a2 times (a2: positive value), and outputs the resulting signal.

The gain stage 111 increases the signal level of the output signal MO of the quantizer 113 by a1 times (a1: positive value), and outputs the resulting signal. The adder 112 adds the output signal of the integrator 107, the output signals of the gain stages 109 to 111, and the random dither RD outputted from the random dither circuit 114, and outputs the resulting signal. The random dither RD is a random signal having a frequency characteristic close to white noise.

The quantizer 113 is, for example, a one-bit quantizer. The quantizer 113 quantizes the output signal of the adder 112 into one bit, and outputs the quantized signal as the output signal MO. The D/A converter 116 converts the output signal MO which is a one-bit digital signal into an analog signal, and outputs the resulting signal as the feedback signal FB.

In the ΔΣ modulator 1 having the above configuration, since the analog input signal AIN is oversampled, the signal level of a quantization error within a desired frequency band contained in the output signal MO is greatly reduced. Further, since the ΔΣ modulator 1 has a feedback loop for returning the output signal MO to the input side as indicated by open arrows in FIG. 2, the quantization error contained in the output signal MO is distributed unevenly in a high frequency band. For this reason, the output signal MO undergoes low-pass filtering in the digital circuit 2 in the subsequent stage, thereby making it possible to greatly reduce the quantization error. Thus distributing the quantization error unevenly in a high frequency band is called "noise shaping".

Figure 3:
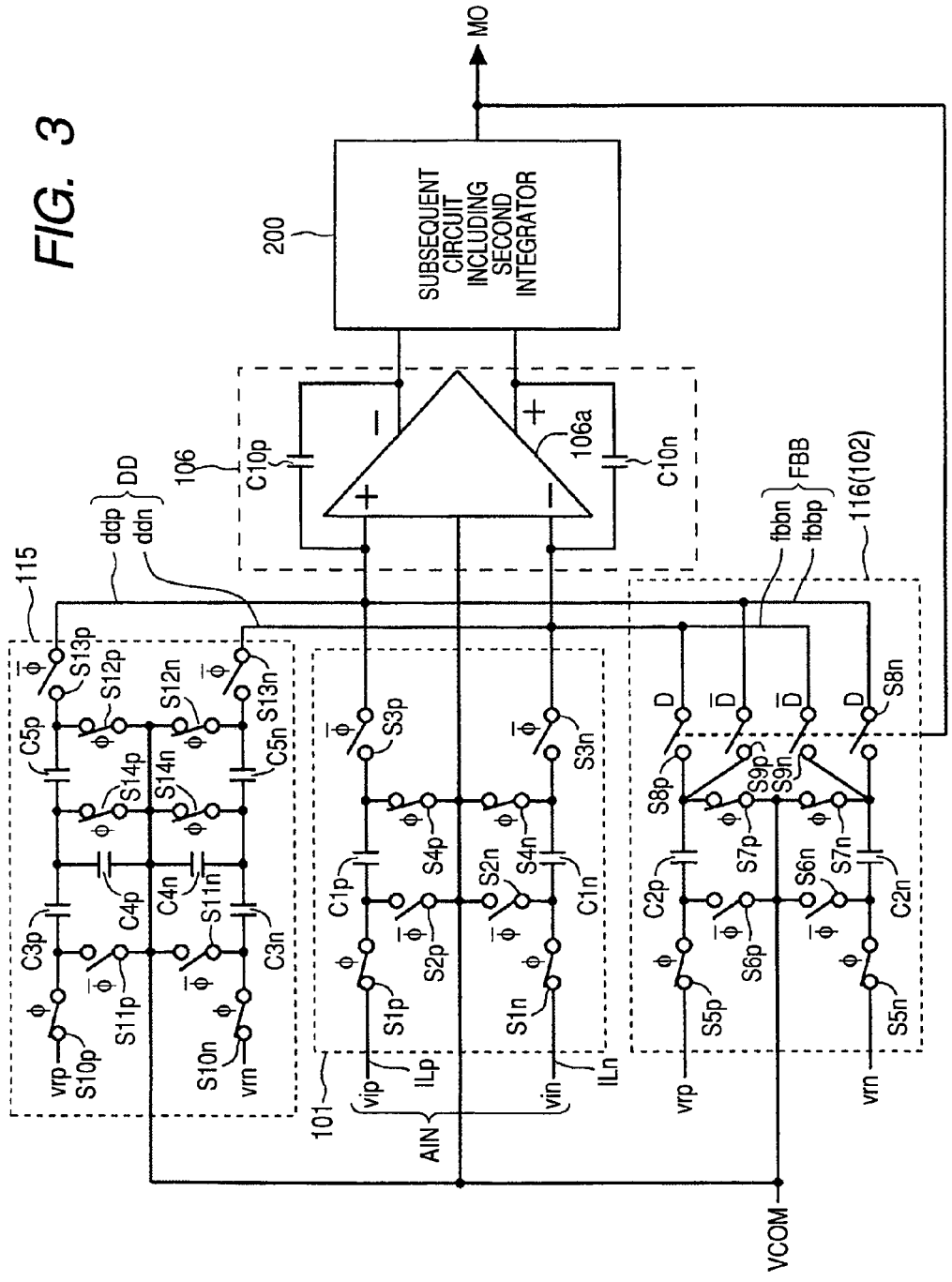
FIG. 3 is a diagram showing the circuit configuration of the ΔΣ modulator according to the first embodiment of the invention.

FIG. 3 is a diagram showing the circuit configuration of the first half stage of the ΔΣ modulator 1. In the first embodiment, the analog input signal AIN is a differential signal comprised of a pair of complementary input signals vin and vip. The respective signal levels of the input signals vip and vin vary with respect to the common voltage VCOM as the center, and the input signal vin is a signal obtained by inverting the input signal vip with respect to the common voltage VCOM. The signal voltage of the analog input signal AIN is a value obtained by subtracting the signal voltage of the input signal vin from the signal voltage of the input signal vip.

Since the analog input signal AIN is a differential signal, the input signals and output signals (excluding the output signal MO in digital form) of elements configuring the ΔΣ modulator 1 are differential signals. For example, the DC addition voltage DD, the random dither RD, and the inverted feedback signal FBB are differential signals. Further, the input line IL to which the analog input signal AIN is inputted is comprised of a pair of signal lines ILp and ILn. Each signal in the ΔΣ modulator 1 may be a single-ended signal.

The DC addition voltage DD is a differential signal comprised of a pair of complementary DC signals ddn and ddp. The signal level of the DC signal ddp is positive, and the signal level of the DC signal ddn is negative. The signal level of the DC addition voltage DD corresponds to a value obtained by subtracting the signal level of the DC signal ddn from the signal level of the DC signal ddp. Further, the inverted feedback signal FBB is a differential signal comprised of a pair of complementary signals fbbn and fbbp. The signal level of the inverted feedback signal FBB corresponds to a value obtained by subtracting the signal level of the signal fbbn from the signal level of the signal fbbp.

As shown in FIG. 3, the gain stage 101 is comprised of a switched capacitor circuit including switch elements S1n to S4n and S1p to S4p and capacitors C1n and C1p. The integrator 106 includes a differential output operational amplifier 106a and hold capacitors C10n and C10p.

In the integrator 106, the non-inverting input terminal of the differential output operational amplifier 106a is coupled to one end of the hold capacitor C10p. The other end of the hold capacitor C10p is coupled to the inverted output terminal of the differential output operational amplifier 106a and the subsequent circuit 200 including the second integrator 107 in the ΔΣ modulator 1. One end of the hold capacitor C10n is coupled to the inverting input terminal of the differential output operational amplifier 106a, and the other end thereof is coupled to the non-inverted output terminal of the differential output operational amplifier 106a and the subsequent circuit 200 including the second integrator 107 in the ΔΣ modulator 1. Further, the common voltage VCOM as an operation common voltage is supplied to the differential output operational amplifier 106a.

In the gain stage 101, one end of the switch element S1p is coupled to the signal line ILp to which the input signal vip is inputted, and the other end of the switch element S1p is coupled to one end of the capacitor C1p and one end of the switch element S2p. The other end of the capacitor C1p is coupled to one end of the switch element S4p and one end of the switch element S3p, and the other end of the switch element S3p is coupled to the non-inverting input terminal of the differential output operational amplifier 106a in the integrator 106. Further, the common voltage VCOM is supplied to the other end of the switch element S2p and the other end of the switch element S4p.

One end of the switch element S1n is coupled to the signal line ILn to which the input signal vin is inputted, and the other end thereof is coupled to one end of the capacitor C1n and one end of the switch element S2n. The other end of the capacitor C1n is coupled to one end of the switch element S4n and one end of the switch element S3n, and the other end of the switch element S3n is coupled to the inverting input terminal of the differential output operational amplifier 106a. Further, the common voltage VCOM is supplied to the other end of the switch element S2n and the other end of the switch element S4n.

The switch elements S1n, S4n, S1p, and S4p are turned from an OFF state to an ON state at the phase φ of each period of the clock signal CLK2, and the ON state is maintained for a predetermined duration. On the other hand, the switch elements S2n, S3n, S2p, and S3p are turned from an OFF state to an ON state at the phase φ bar (depicted in the drawing by φ with a bar thereover) of each period of the clock signal CLK2, and the ON state is maintained for a predetermined duration. The phase φ and the phase φ bar are in opposite phase, that is, 180° out of phase with each other.

In the gain stage 101 having the above configuration, as the switch elements S1p to S3p perform regular switching operations based on the clock signal CLK2, the input signal vip inputted to the signal line ILp is sampled, for example, at a frequency 64 times the sampling frequency fs, and the signal level of the sampled input signal vip is adjusted. Further, in the gain stage 101, as the switch elements S1n to S3n perform regular switching operations based on the clock signal CLK2, the input signal vin inputted to the signal line ILn is sampled also at the frequency 64 times the sampling frequency fs, and the signal level of the sampled input signal vin is adjusted.

The D/A converter 116 is comprised of a switched capacitor circuit as in the gain stage 101, and includes switch elements S5n to S9n and S5p to S9p and capacitors C2n and C2p. The D/A converter 116 shown in FIG. 3 also has the function of the gain stage 102.

The plus reference voltage vrp is supplied to one end of the switch element S5p, and the other end thereof is coupled to one end of the capacitor C2p and one end of the switch element S6p. The other end of the capacitor C2p is coupled to one end of the switch element S7p, one end of the switch element S8p, and one end of the switch element S9p. The other end of the switch element S8p is coupled to the inverting input terminal of the differential output operational amplifier 106a in the integrator 106, and the other end of the switch element S9p is coupled to the non-inverting input terminal of the differential output operational amplifier 106a. Further, the common voltage VCOM is supplied to the other end of the switch element S6p and the other end of the switch element S7p.

The minus reference voltage vrn is supplied to one end of the switch element S5n, and the other end thereof is coupled to one end of the capacitor C2n and one end of the switch element S6n. The other end of the capacitor C2n is coupled to one end of the switch element S7n, one end of the switch element S8n, and one end of the switch element S9n. The other end of the switch element S8n is coupled to the non-inverting input terminal of the differential output operational amplifier 106a, and the other end of the switch element S9n is coupled to the inverting input terminal of the differential output operational amplifier 106a. Further, the common voltage VCOM is supplied to the other end of the switch element S6n and the other end of the switch element S7n.

The switch elements S5n, S7n, S5p, and S7p are turned from an OFF state to an ON state at the phase φ of each period of the clock signal CLK2, and the ON state is maintained for a predetermined duration. On the other hand, the switch elements S6n and S6p are turned from an OFF state to an ON state at the phase φ bar of each period of the clock signal CLK2, and the ON state is maintained for a predetermined duration. Further, the switch elements S8n and S8p are turned to an ON state in the case of a signal D indicating that the output signal MO outputted from the quantizer 113 is a high level, and the switch elements S9n and S9p are turned to an ON state in the case of a signal D bar (depicted in the drawing by D with a bar thereover) indicating that the output signal MO is a low level.

In the D/A converter 116 having the above configuration, the output signal MO from the quantizer 113 is converted into a differential signal in analog form, and a pair of analog signals configuring the differential signal are inverted, thereby obtaining a pair of signals fbbn and fbbp configuring the inverted feedback signal FBB. When the phase of the clock signal CLK2 is at the phase φ bar, the signals fbbn and fbbp are added to the output signals from the switch elements S3n and S3p in the gain stage 101, respectively. Thus, the difference signal between the output signal of the gain stage and the feedback signal FB is obtained every period of the clock signal CLK2.

In the circuit configuration shown in FIG. 3, the coupling point among the switch element S3p in the gain stage and the switch elements S8n and S9p in the D/A converter and the coupling point among the switch element S3n in the gain stage 101 and the switch elements S8p and S9n in the D/A converter 116 function as the adder 103 shown in FIG. 2.

The DC dither circuit 115 is comprised of a switched capacitor circuit as in the gain stage 101 and the D/A converter 116, and includes switch elements S10n to S14n and S10p to S14p and capacitors C3n to C5n and C3p to C5p. The plus reference voltage vrp is supplied to one end of the switch element S10p, and the other end thereof is coupled to one end of the switch element S11p and one end of the capacitor C3p. The other end of the capacitor C3p is coupled to one end of the capacitor C4p, one end of the capacitor C5p, and one end of the switch element S14p, and the other end of the capacitor C5p is coupled to one end of the switch element S12p and one end of the switch element S13p. The other end of the switch element S13p is coupled to the non-inverting input terminal of the differential output operational amplifier 106a. Further, the common voltage VCOM is supplied to the other end of the switch element S11$p$, the other end of the capacitor C4$p$, the other end of the switch element S12$p$, and the other end of the switch element S14$p$.

The minus reference voltage vrn is supplied to one end of the switch element S10$n$, and the other end thereof is coupled to one end of the switch element S11$n$ and one end of the capacitor C3$n$. The other end of the capacitor C3$n$ is coupled to one end of the capacitor C4$n$, one end of the capacitor C5$n$, and one end of the switch element S14$n$, and the other end of the capacitor C5$n$ is coupled to one end of the switch element S12$n$ and one end of the switch element S13$n$. The other end of the switch element S13$n$ is coupled to the inverting input terminal of the differential output operational amplifier 106$a$. Further, the common voltage VCOM is supplied to the other end of the switch element S11$n$, the other end of the capacitor C4$n$, the other end of the switch element S12$n$, and the other end of the switch element S14$n$.

The switch elements S10$n$, S12$n$, S14$n$, S10$p$, S12$p$, and S14$p$ are turned from an OFF state to an ON state at the phase φ of each period of the clock signal CLK2, and the ON state is maintained for a predetermined duration. On the other hand, the switch elements S11$n$, S13$n$, S11$p$, and S13$p$ are turned from an OFF state to an ON state at the phase φ bar of each period of the clock signal CLK2, and the ON state is maintained for a predetermined duration.

In the DC dither circuit 115 having the above configuration, as the switch elements S11$p$ to S13$p$ perform regular switching operations based on the clock signal CLK2, the DC signal ddp outputted from the switch elements S13$p$ is superimposed on the difference signal between the output signal from the switch element S3$p$ in the gain stage 101 and the signal fbbp from the D/A converter 116.

Further, in the DC dither circuit 115, as the switch elements S11$n$ to S13$n$ perform regular switching operations based on the clock signal CLK2, the DC signal ddn outputted from the switch elements S13$n$ is superimposed on the difference signal between the output signal from the switch element S3$n$ in the gain stage 101 and the signal fbbn from the D/A converter 116.

The difference signal between the output signal of the switch element S3$n$ and the signal fbbn and the difference signal between the output signal of the switch element S3$p$ and the signal fbbp are generated every period of the clock signal CLK2, and also the DC signals ddn and ddp are generated every period of the clock signal CLK2. Therefore, the signal obtained by superimposing the DC addition voltage DD on the difference signal between the output signal of the gain stage 101 and the feedback signal FB is inputted to the integrator 106 every period of the clock signal CLK2, more specifically, every phase φ bar of each period of the clock signal CLK2. Consequently, the integrator 106 integrates the difference between the output signal of the gain stage 101 and the feedback signal FB every period of the clock signal CLK2.

The signal level of the DC signal ddp generated by the DC dither circuit 115 depends on the capacitance value of a combined capacitor comprised of the capacitors C3$p$ to C5$p$. For example, if the power supply voltage AVdd is 5V, the signal level of the DC signal ddp is set to a very small value, e.g., several mV to several tens mV. Accordingly, the capacitance value of the combined capacitor comprised of the capacitors C3$p$ to C5$p$ is set to a very small value.

On the other hand, decreases in the respective capacitance values of the capacitors C3$p$ to C5$p$ increase the error of the DC signal ddp by a mismatch among these capacitance values which occurs at the time of switching operations of the switch elements S10$p$ to S13$p$.

In the DC dither circuit 115 according to the first embodiment, the capacitance values of the capacitors C3$p$ and C5$p$ are identical to each other, and the capacitance value of the capacitor C4$p$ is K (K≧1) times the capacitance value of the capacitor C3$p$ or C5$p$. The capacitors C3$p$ to C5$p$ are coupled in a T shape. If the capacitance value of the capacitor C3$p$ or C5$p$ is "C", the capacitance value of the combined capacitor comprised of the capacitors C3$p$ to C5$p$ is equal to C/(k+2). As can be seen from this equation, in the DC dither circuit 115, it is possible to decrease the capacitance value of the combined capacitor comprised of the capacitors C3$p$ to C5$p$ while increasing the respective capacitance values of the capacitors C3$p$ to C5$p$. Therefore, it is possible to achieve a minute DC signal ddp while suppressing the error of the DC signal ddp by a mismatch among the capacitance values which occurs at the time of switching operations of the switch elements S10$p$ to S13$p$.

In the same way, in the DC dither circuit 115 according to this embodiment, it is possible to achieve a minute DC signal ddn while suppressing the error of the DC signal ddn by a mismatch among the capacitance values which occurs at the time of switching operations of the switch elements S10$n$ to S13$n$.

Figure 4:
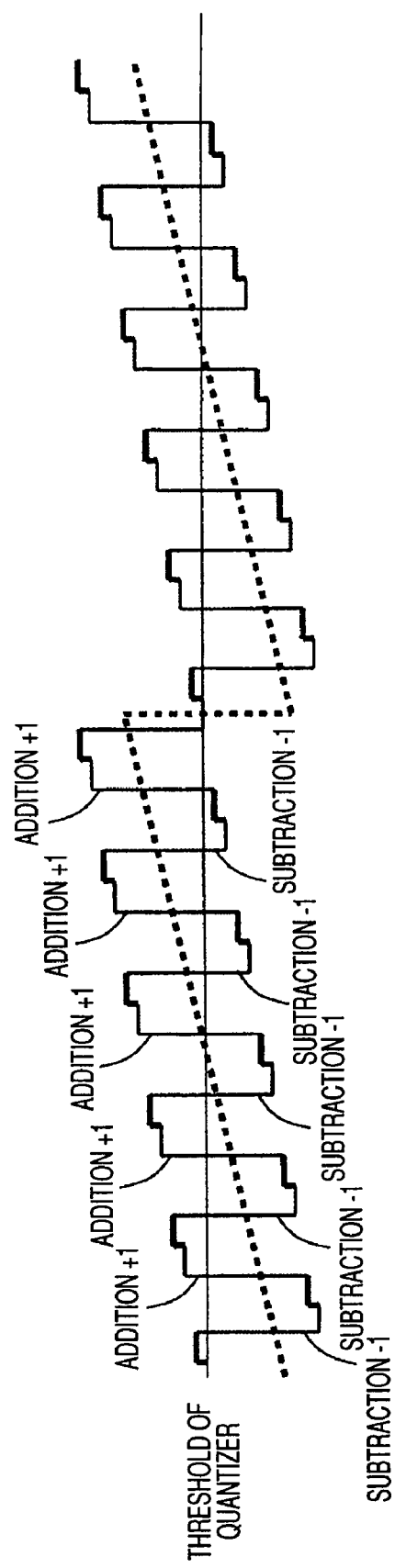
FIG. 4 is a diagram illustrating an idle tone which occurs in the ΔΣ modulator.
Figure 5:
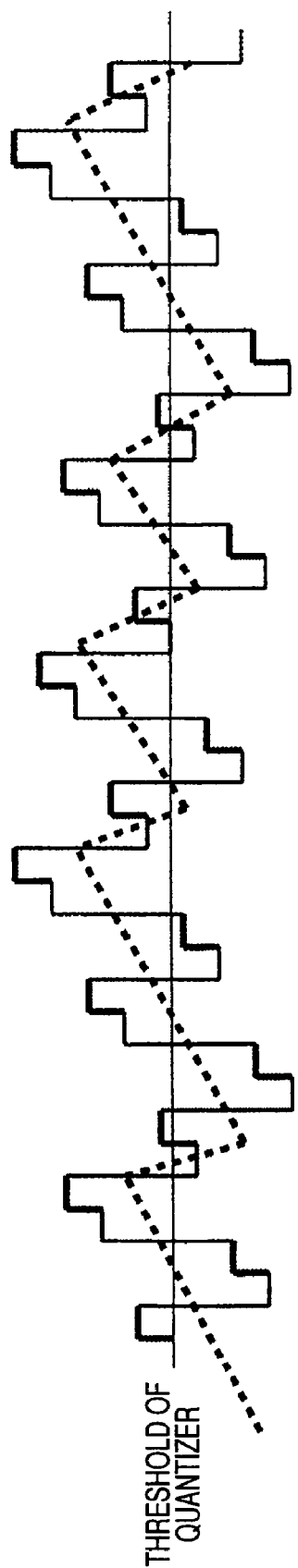
FIG. 5 is a diagram illustrating an idle tone which occurs in the ΔΣ modulator.

Next, description will be made of an idle tone which occurs in the ΔΣ modulator 1. FIGS. 4 and 5 are diagrams illustrating idle tones. FIG. 4 shows the occurrence image of an idle tone by a broken line in the case where a relatively small DC signal is inputted to the ΔΣ modulator 1, and FIG. 5 shows the occurrence image of an idle tone by a broken line in the case where a relatively large DC signal is inputted to the ΔΣ modulator 1. Solid lines shown in FIGS. 4 and 5 indicate the input signal to the quantizer 113 in the case where the analog input signal AIN is not inputted to the ΔΣ modulator 1 and the random dither RD is not superimposed. For simplicity of explanation, the waveforms of the single-ended input signal to the quantizer 113 are shown in FIGS. 4 and 5. Thick solid lines shown in FIGS. 4 and 5 indicate the integral amount of the DC signal inputted to the ΔΣ modulator 1 performed by the integrating circuit 120 during one period of the clock signal CLK2.

As shown in FIGS. 4 and 5, since a DC signal which is intentionally inputted to the ΔΣ modulator 1 or a DC offset (DC signal) which occurs automatically in the ΔΣ modulator 1 is integrated by the integrating circuit 120, an input signal to the quantizer 113 increases. When the input signal to the quantizer 113 exceeds a threshold value of the quantizer 113, the output signal MO of a high level is outputted from the quantizer 113 and negatively fed back to the input side. As a result, the level of the input signal to the integrating circuit 120 decreases, and the level of the input signal to the quantizer 113 decreases by a predetermined amount (subtraction −1). At this time, since the DC signal inputted to the ΔΣ modulator 1 is superimposed on the input signal to the integrating circuit 120, the level of the input signal to the quantizer 113 increases by the integral amount (thick solid line) of the DC signal by the integrating circuit 120.

When the input signal to the quantizer 113 decreases and falls below the threshold value of the quantizer 113, the output signal MO of a low level is outputted from the quantizer 113 and negatively fed back to the input side. As a result, the level of the input signal to the integrating circuit 120 increases, and the level of the input signal to the quantizer 113 increases by a predetermined amount (addition +1). At this time, since the DC signal is superimposed on the input signal to the integrating circuit 120, the level of the input signal to the quantizer 113 increases by the integral amount (thick solid line) of the DC signal by the integrating circuit 120.

In the ΔΣ modulator 1, the DC signal is integrated, and "subtraction −1" or "addition +1" are performed every period of the clock signal CLK2. Consequently, as shown in FIGS. 4 and 5, the idle tone of a triangular wave indicated by the broken line is contained in the input signal to the quantizer 113. As a result, an idle tone occurs also in the output signal MO of the quantizer 113. As shown in FIGS. 4 and 5, the frequency of the idle tone increases as the level of the DC signal inputted to the ΔΣ modulator 1 increases. The reason is as follows. As the level of the DC signal increases, the integral amount of the DC signal in one period of the clock signal CLK2 increases, which reduces time from when the level of the input signal to the quantizer 113 exceeds the threshold value of the quantizer 113 to when the level of the input signal falls below the threshold value.

In FIGS. 4 and 5, for the sake of clarity of an effect exercised by the DC signal inputted to the ΔΣ modulator 1 on the input signal to the quantizer 113, the time at which the input signal to the quantizer 113 changes when the DC signal inputted to the ΔΣ modulator 1 is integrated is shifted from the time at which the input signal to the quantizer 113 changes when the output signal MO is negatively fed back to the input side. However, in the actual operation of the ΔΣ modulator 1, the negative feedback of the output signal MO to the input side and the integral of the DC signal inputted to the ΔΣ modulator 1 are performed at approximately the same time; therefore, the input signal to the quantizer 113 does not change by the integral amount of the DC signal after the change caused by the negative feedback of the output signal MO, but changes at once by the amount obtained by adding the integral amount of the DC signal to the change amount ("addition +1" or "subtraction −1") caused by the negative feedback of the output signal MO.

In the first embodiment, the adder 112 superimposes the random dither RD outputted from the random dither circuit 114 on the original input signal to the quantizer 113. Accordingly, the random dither RD is also superimposed on the idle tone contained in the input signal to the quantizer 113. If the random dither RD is superimposed on the idle tone indicated by the broken line in FIGS. 4 and 5, the periodicity of the idle tone is lost so that the level of the periodic noise signal is reduced. Therefore, it is possible to suppress the adverse effect of the idle tone.

Thus, since the frequency of the idle tone increases as the DC signal inputted to the ΔΣ modulator 1 becomes larger; by superimposing the DC addition voltage DD on the input signal to the integrating circuit 120 as described above, it is possible to shift the frequency of the idle tone to a frequency band higher than a desired frequency band. In the case of an audio ΔΣ-type A/D converter such as the ΔΣ-type A/D converter according to the first embodiment, it is possible to shift the frequency of the idle tone to a frequency band higher than the audible range to prevent persons from hearing unwanted noise.

The phenomenon in which the DC addition voltage DD shifts the frequency of the idle tone occurs in a ΔΣ-type A/D converter including only one channel for converting an analog input signal into a digital signal. However, in the ΔΣ-type A/D converter including a plurality of channels for converting analog input signals into digital signals such as the ΔΣ-type A/D converter according to the first embodiment, the mutual interference between the channels, the phenomenon does not always occur by simple use of the DC addition voltage DD, which will be described in detail later.

Figure 6:
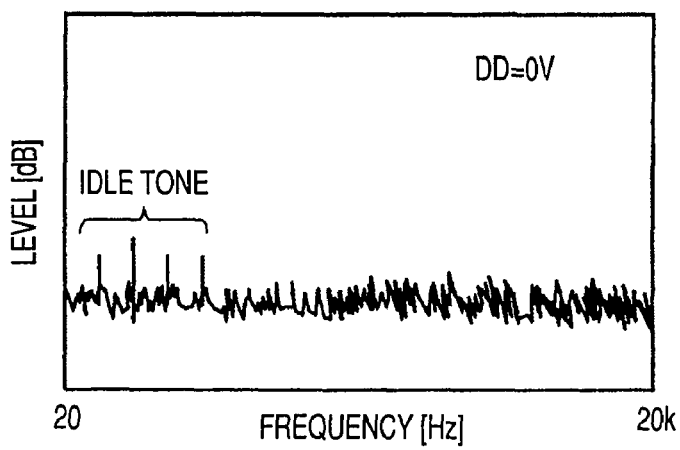
FIG. 6 is a graph showing a frequency characteristic of an output signal of the ΔΣ modulator in one channel in the case where a DC addition voltage is not supplied.
Figure 7:
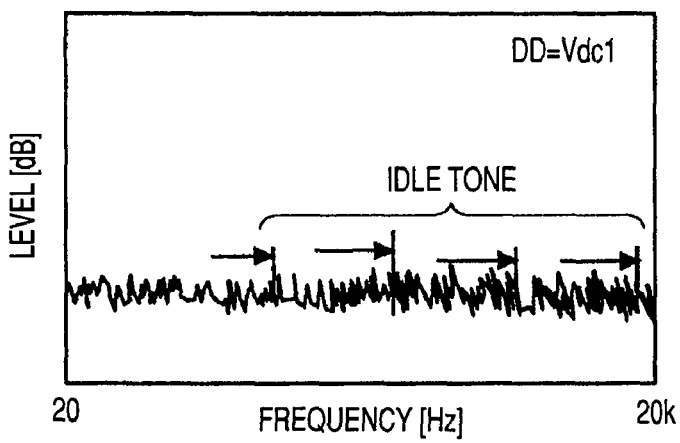
FIG. 7 is a graph showing a frequency characteristic of an output signal of the ΔΣ modulator in one channel in the case where a DC addition voltage is supplied.
Figure 8:
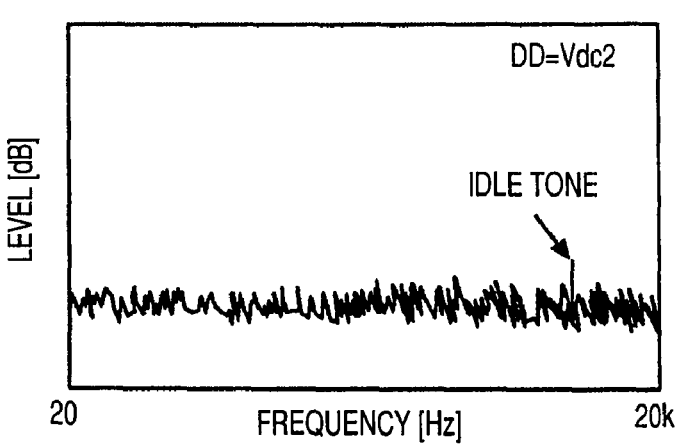
FIG. 8 is a graph showing a frequency characteristic of an output signal of the ΔΣ modulator in one channel in the case where a DC addition voltage is supplied.

FIGS. 6 to 8 are graphs showing frequency characteristics of the output signal MO of the ΔΣ modulator 1 in one of the L channel Lch and the R channel Rch in the ΔΣ-type A/D converter according to the first embodiment with the other channel eliminated. That is, FIGS. 6 to 8 show frequency characteristics of the output signal of the ΔΣ modulator in the ΔΣ-type A/D converter including only one channel for converting an analog input signal into a digital signal.

FIGS. 6 to 8 show frequency characteristics of the output signal MO in the case where the analog input signal AIN is not inputted to the ΔΣ modulator 1 and the random dither RD is not used. The same applies to frequency characteristics of the output signal MO shown in FIGS. 9 to 11 and 13 described later.

FIG. 6 shows a frequency characteristic of the output signal MO in the case where the DC addition voltage DD is not superimposed on the input signal to the integrating circuit 120. FIG. 7 shows a frequency characteristic of the output signal MO in the case where the DC addition voltage DD=Vdc1 (>0V). FIG. 8 shows a frequency characteristic of the output signal MO in the case where the DC addition voltage DD=Vdc2 (>Vdc1).

As shown in FIG. 6, in the case where the DC addition voltage DD is not used, by inputting a DC signal to the integrating circuit 120, idle tones having audio frequencies occur in the ΔΣ modulator 1. If the DC addition voltage DD is used in this ΔΣ modulator 1, the frequencies of the idle tones shift to higher frequencies as shown in FIG. 7. Further, if the DC addition voltage DD of a larger level is used, the frequencies of most idle tones shift to a frequency band higher than the audible range.

On the other hand, in the ΔΣ-type A/D converter including the two channels which are the L channel Lch and the R channel Rch according to this embodiment, if the signal level of the DC addition voltage DD in the ΔΣ modulator 1L of the L channel Lch matches the signal level of the DC addition voltage DD in the ΔΣ modulator 1R of the R channel Rch; due to the mutual interference between the channels, a phenomenon in which the frequencies of the idle tones do not shift much in the L channel Lch and the R channel Rch so that the frequencies of the idle tones cannot be shifted to a frequency band higher than the audible range is confirmed. Hereinafter, this phenomenon will be described.

Figure 9:
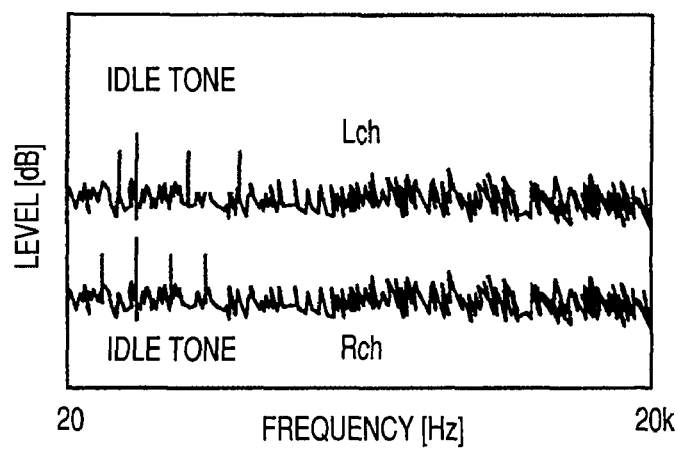
FIG. 9 is a graph showing frequency characteristics of output signals of ΔΣ modulators in two channels in the case where a DC addition voltage is not supplied.

FIG. 9 is a graph showing frequency characteristics of the output signals MO of the ΔΣ modulators 1L and 1R in the case where the DC addition voltage DD is not used in the ΔΣ modulators 1L and 1R in the ΔΣ-type A/D converter according to the first embodiment. The upper and lower waveforms in FIG. 9 show the output signals MO of the ΔΣ modulators 1L and 1R, respectively. Further, in FIGS. 10, 11, and 13 described later, the upper and lower waveforms show the output signals MO of the ΔΣ modulators 1L and 1R, respectively.

As shown in FIG. 9, in the output signal MO of the ΔΣ modulator 1L in the L channel Lch and the output signal MO of the ΔΣ modulator 1R in the R channel Rch, idle tones occur at similar frequencies. This is because the circuit layout pattern of the L channel Lch is configured substantially similar to the circuit layout pattern of the R channel Rch.

Figure 10:
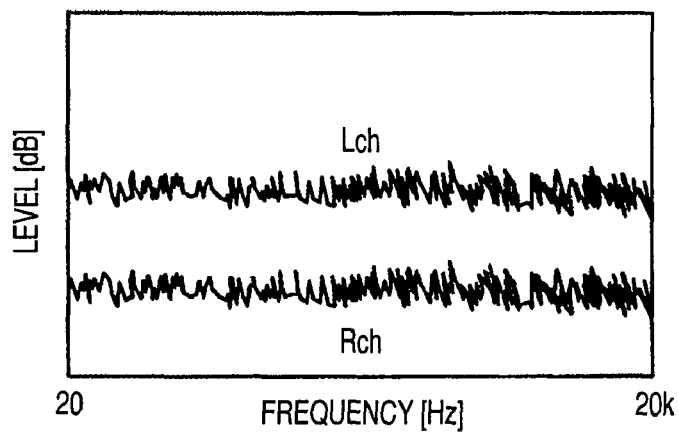
FIG. 10 is a graph showing ideal frequency characteristics of output signals of the ΔΣ modulators in two channels in the case where the same DC addition voltage between the channels is supplied.

If there occurs no mutual interference between the channels in the ΔΣ-type A/D converter in which the output signals MO of the ΔΣ modulators 1L and 1R have such frequency characteristics as shown in FIG. 9, when the DC addition voltage DD of the same signal level is generated in the ΔΣ modulators 1L and 1R, the frequencies of the idle tones can be shifted to a frequency band higher than the audible range in the L channel Lch and the R channel Rch as shown in FIG. 10.

However, in reality, the mutual interference between the channels occurs in the ΔΣ-type A/D converter including a plurality of channels for converting analog input signals into digital signals according to this embodiment. In the manufacture of the ΔΣ-type A/D converter according to the first embodiment, the circuit of the L channel Lch and the circuit of the R channel Rch are formed over the same semiconductor substrate to simplify the structure of the device. Further, as shown in FIG. 1, the reference voltage generating circuit 3 and the common voltage generating circuit 4 are shared between the L channel Lch and the R channel Rch, and the common power supply voltage AVdd and ground voltage AVss are supplied to the ΔΣ modulators 1L and 1R. Accordingly, the common impedance of wiring exists necessarily between the L channel Lch and the R channel Rch. Therefore, it is difficult to avoid the mutual interference between the L channel Lch and the R channel Rch, and the circuit of the L channel Lch and the circuit of the R channel Rch are coupled so that signals of the L channel Lch get into the R channel Rch and signals of the R channel Rch get into the L channel Lch.

Figure 11:
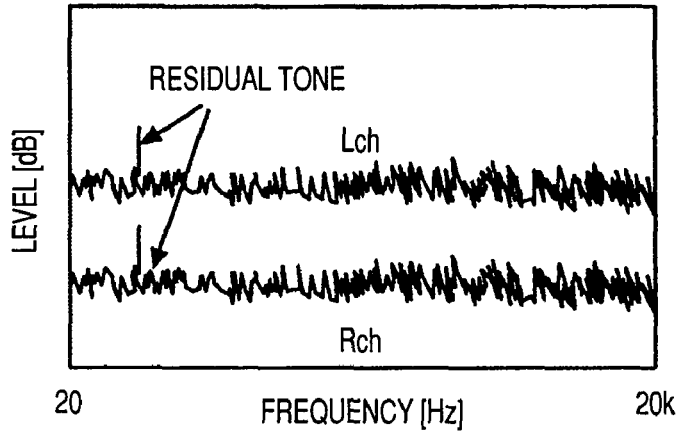
FIG. 11 is a graph showing actual frequency characteristics of output signals of the ΔΣ modulators in two channels in the case where the same DC addition voltage between the channels is supplied.

In the ΔΣ-type A/D converter in which the mutual interference between the channels exists, it is confirmed that, when the DC addition voltages DD of the same signal level is generated in the ΔΣ modulators 1L and 1R, the output signals MO of the ΔΣ modulators 1L and 1R do not have such ideal frequency characteristics as shown in FIG. 10 but exhibit such frequency characteristics as shown in FIG. 11.

If the DC addition voltage DD is used in the L channel Lch and the R channel Rch, a plurality of idle tones which exit at mutually different frequencies as shown in FIG. 9 in the channels are concentrated at a certain frequency in the audible range as shown in FIG. 11. Even if the level of the DC addition voltage DD is increased, the idle tones do not shift much from this frequency.

Figure 12:
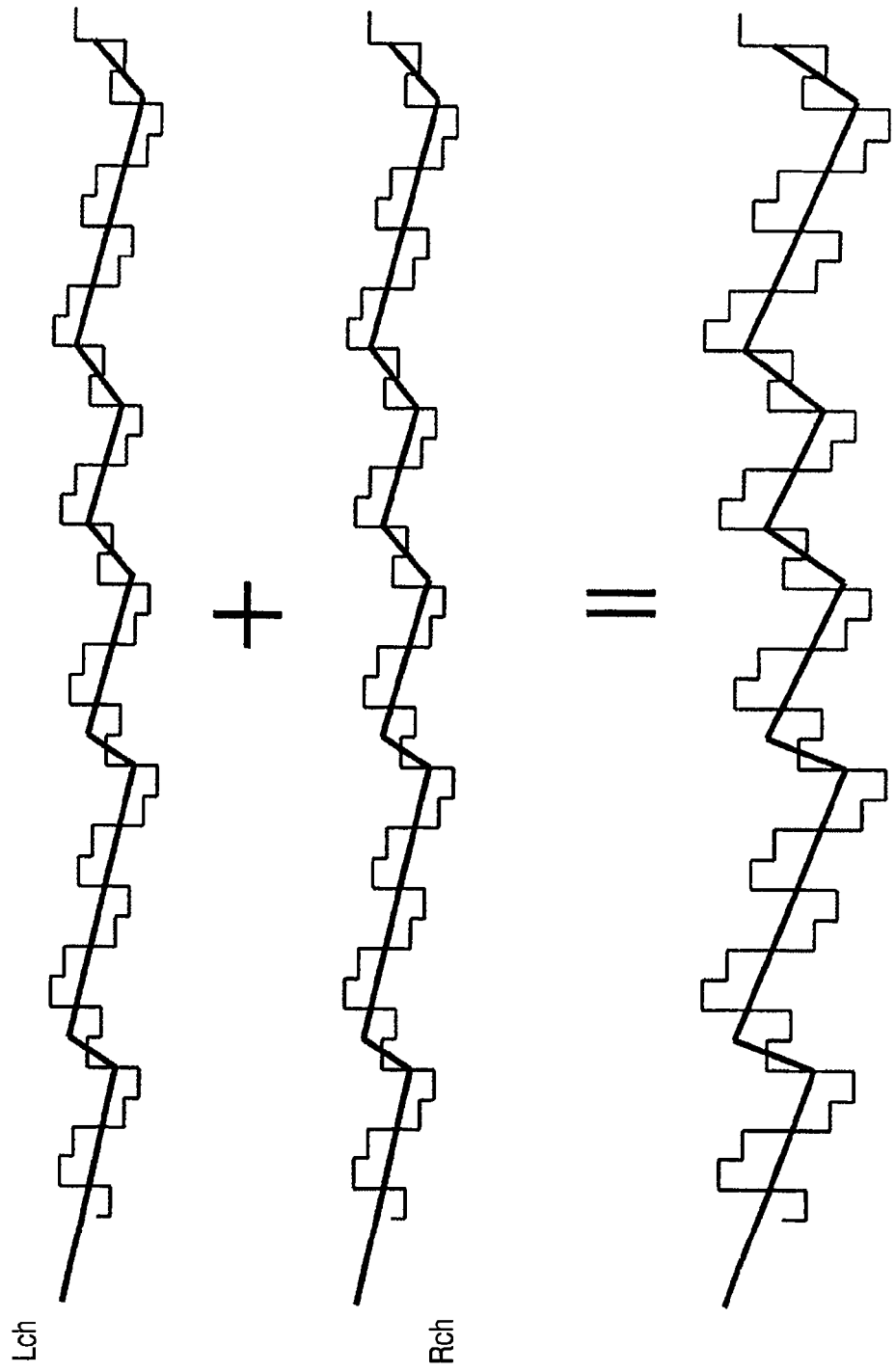
FIG. 12 is a diagram illustrating the reason why the frequencies of idle tones do not shift in the case where the same DC addition voltage between the channels is supplied.

In such a case where the same DC addition voltage DD is used in the L channel Lch and the R channel Rch, the frequencies of the idle tones do not shift much in the L channel Lch and the R channel Rch so that it is difficult to shift the frequencies of the idle tones to a frequency band higher than the desired frequency band. The reason is as follows. The idle tone in the L channel Lch has substantially the same frequency as the idle tone in the R channel Rch as shown in FIG. 12; therefore, if both the idle tones are combined due to the mutual interference between the channels, the signal levels of the idle tones in the channels increase, thereby making it difficult to shift the frequencies of the idle tones in the channels.

If the substrate, power supply line, or ground line is separated between the channels or the power supply line or ground line is reinforced, it is possible to reduce the mutual interference between the L channel Lch and the R channel Rch, thereby making it easy to shift the frequencies of the idle tones. However, if such an interference prevention measure is performed, the circuit layout pattern becomes complicated, so that it becomes difficult to make the ΔΣ-type A/D converter compact and the cost of the device increases.

For this reason, in the first embodiment, the signal level of the DC addition voltage DD in the ΔΣ modulator 1L provided in the L channel Lch is set to be different from the signal level of the DC addition voltage DD in the ΔΣ modulator 1R provided in the R channel Rch. For example, if the power supply voltage AVdd is 5V, the signal level difference in the DC addition voltage DD between the ΔΣ modulator 1L and the ΔΣ modulator 1R is set to several mV to several tens mV.

Figure 13:
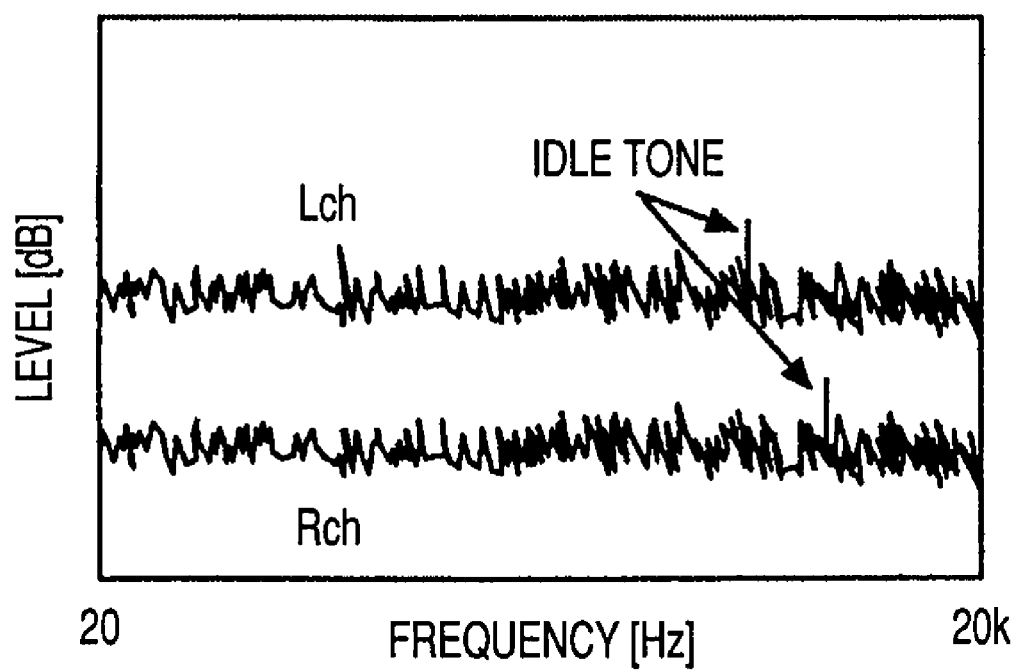
FIG. 13 is a graph showing frequency characteristics of output signals of the ΔΣ modulators in two channels in the case where different DC addition voltages between the channels are supplied.
Figure 14:
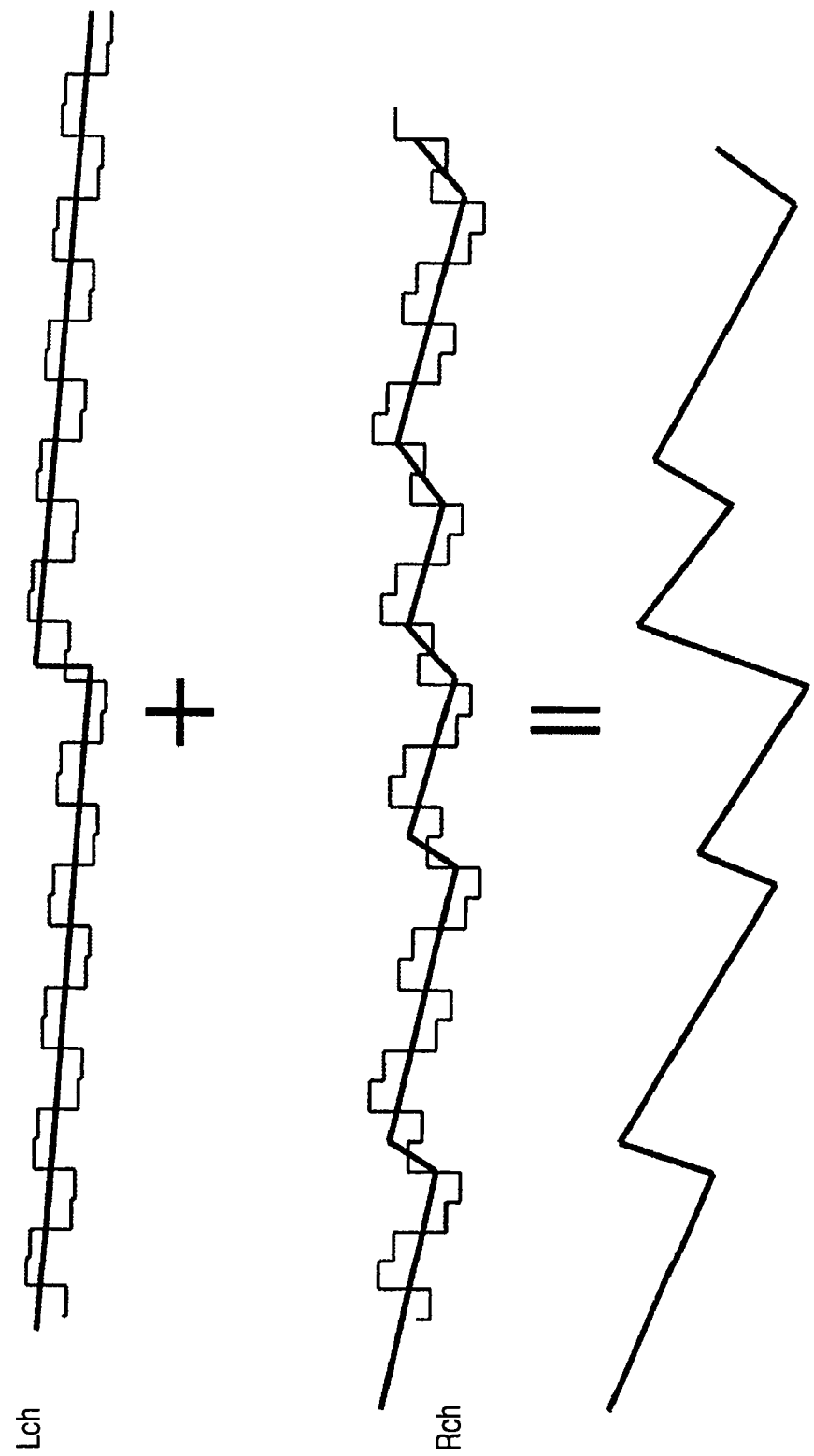
FIG. 14 is a diagram illustrating the reason why the frequencies of idle tones shift in the case where different DC addition voltages between the channels are supplied.

FIG. 13 is a graph showing frequency characteristics of the output signals MO of the ΔΣ modulators 1L and 1R in the case where the signal levels of the DC addition voltages DD in the ΔΣ modulators 1L and 1R are set to be different from each other in the ΔΣ-type A/D converter having the frequency characteristics shown in FIG. 9 without using the DC addition voltage DD. As can be seen from FIGS. 9 and 13, when the DC addition voltages DD of different levels are generated in the L channel Lch and the R channel Rch, the frequencies of the idle tones are shifted in the L channel Lch and the R channel Rch. If the DC addition voltages DD of different levels are used in the L channel Lch and the R channel Rch, the frequency of the idle tone in the L channel Lch becomes different from the frequency of the idle tone in the R channel Rch as shown in FIG. 14. Even if both the idle tones are combined due to the mutual interference between the channels, only an idle tone of a new frequency is generated, and the levels of the idle tones in the channels do not increase much, thereby making it easy to shift the frequencies of the idle tones in the channels.

In order to set the signal level of the DC addition voltage DD in the ΔΣ modulator 1L to be different from the signal level of the DC addition voltage DD in the ΔΣ modulator 1R, the capacitance values of capacitors are made different between the ΔΣ modulator 1L and the ΔΣ modulator 1R. For example, the respective capacitance values of the capacitors C4p and C4n are made different between the ΔΣ modulators 1L and 1R.

As described above, in the ΔΣ-type A/D converter according to the first embodiment, since the different DC addition voltages DD are used in the L channel Lch and the R channel Rch, it is possible to shift the frequencies of the idle tones to a frequency band higher than the desired frequency band in the L channel Lch and the R channel Rch. Therefore, it is possible to suppress the adverse effect of the idle tones in the L channel Lch and the R channel Rch.

Second Embodiment

Figure 15:
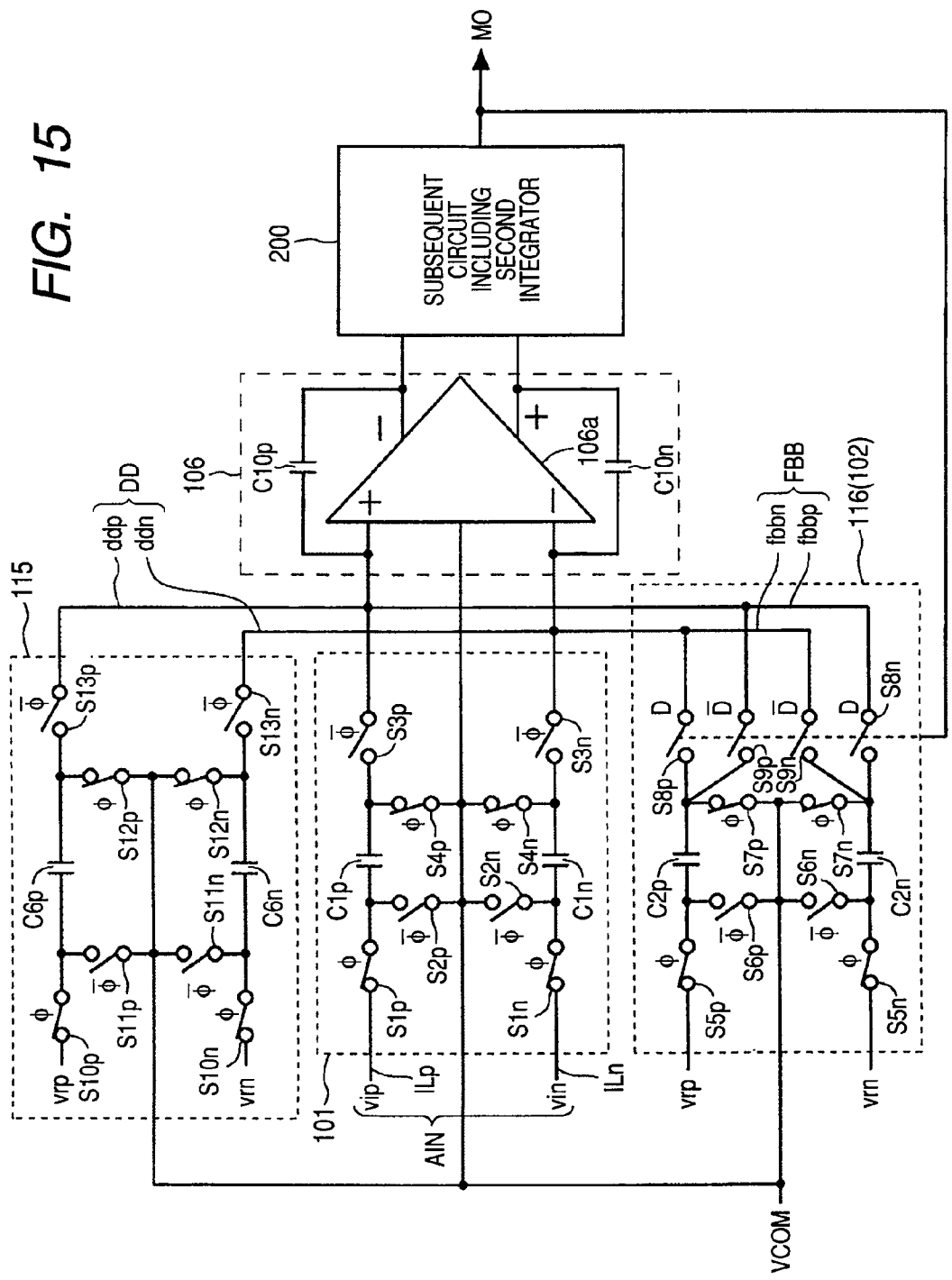
FIG. 15 is a diagram showing the circuit configuration of a ΔΣ modulator according to a second embodiment of the invention.

While, in the first embodiment, the circuit configuration shown in FIG. 3 is adopted as a circuit configuration of the ΔΣ modulator 1, a circuit configuration shown in FIG. 15 may be adopted. FIG. 15 is a diagram showing the configuration of a ΔΣ modulator 1 according to a second embodiment of the invention. The ΔΣ modulator 1 according to the second embodiment is formed by changing only the configuration of the DC dither circuit 115 in the ΔΣ modulator 1 according to the first embodiment.

As shown in FIG. 15, in a DC dither circuit 115 according to the second embodiment, a capacitor C6n is used instead of the capacitors C3n to C5n in the DC dither circuit 115 according to the first embodiment, and a capacitor C6p is used instead of the capacitors C3p to C5p. One end of the capacitor C6p is coupled to the coupling point between the switch elements S10p and S11p, and the other end of the capacitor C6p is coupled to the coupling point between the switch elements S12p and S13p. Further, one end of the capacitor C6n is coupled to the coupling point between the switch elements S10n and S11n, and the other end of the capacitor C6n is coupled to the coupling point between the switch elements S12n and S13n.

In the case of using the capacitor C6p instead of the T-coupled capacitors C3p to C5p, if the capacitance value of the capacitor C6p is decreased to decrease the level of the DC signal ddp, an error occurs in the DC signal ddp by a mismatch among the capacitance values; however, the circuit configuration of the DC dither circuit 115 can be simplified. Similarly, in the case of using the capacitor C6n instead of the T-coupled capacitors C3n to C5n, if the capacitance value of the capacitor C6n is decreased to decrease the level of the DC signal ddn, an error occurs in the DC signal ddn by a mismatch among the capacitance values; however, the circuit configuration of the DC dither circuit 115 can be simplified.

In order to set the signal level of the DC addition voltage DD in the L channel Lch to be different from the signal level of the DC addition voltage DD in the R channel Rch, the respective capacitance values of the capacitors C6n and C6p are made different between the ΔΣ modulators 1L and 1R.

Third Embodiment

Figure 16:
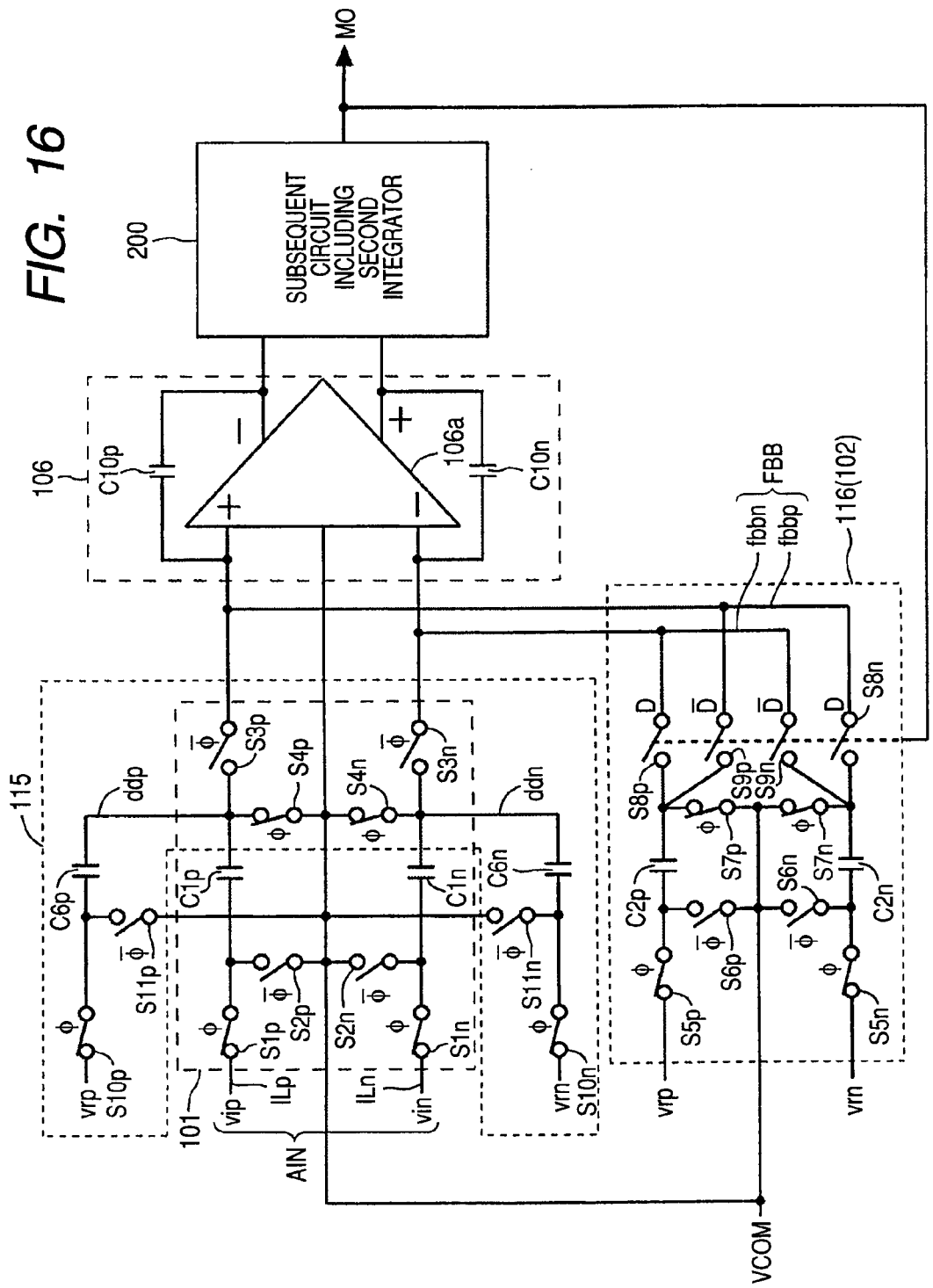
FIG. 16 is a diagram showing the circuit configuration of a ΔΣ modulator according to a third embodiment of the invention.

A circuit configuration shown in FIG. 16 may be adopted as a circuit configuration of the ΔΣ modulator 1. FIG. 16 is a diagram showing the configuration of a ΔΣ modulator 1 according to a third embodiment of the invention. The ΔΣ modulator 1 according to the third embodiment is formed by changing only the configuration of the DC dither circuit 115 in the ΔΣ modulator 1 according to the second embodiment.

As shown in FIG. 16, a DC dither circuit 115 according to the third embodiment includes the switch elements S10n, S11n, S10p, and S11p and the capacitors C6n and C6p of the DC dither circuit 115 according to the second embodiment, and shares the switch elements S3n, S4n, S3p, and S4p with the gain stage 101. In the DC dither circuit 115 according to the third embodiment, one end of the capacitor C6p is coupled to the coupling point between the switch elements S10p and S11p, and the other end of the capacitor C6p is coupled to the coupling point between the switch elements S3p and S4p which are shared between the DC dither circuit 115 and the gain stage 101. One end of the capacitor C6n is coupled to the coupling point between the switch elements S10n and S11n, and the other end of the capacitor C6n is coupled to the coupling point between the switch elements S3n and S4n which are shared between the DC dither circuit 115 and the gain stage 101.

By sharing the switch elements S3n, S4n, S3p, and S4p between the DC dither circuit 115 and the gain stage 101, it is possible to reduce the number of switch elements used in the ΔΣ modulator 1 and simplify the circuit configuration of the ΔΣ modulator 1.

Fourth Embodiment

Figure 17:
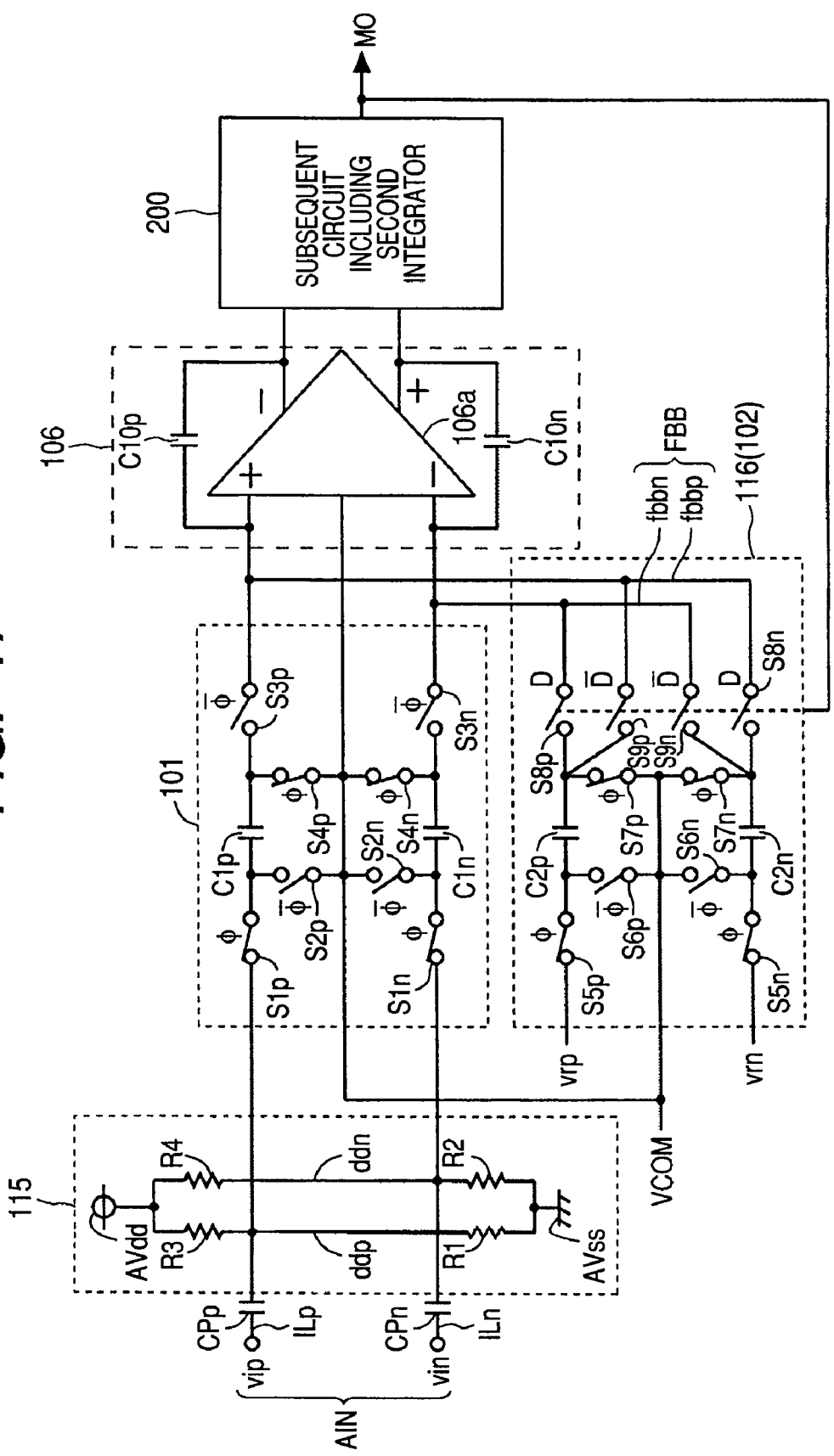
FIG. 17 is a diagram showing the circuit configuration of a ΔΣ modulator according to a fourth embodiment of the invention.

A circuit configuration shown in FIG. 17 may be adopted as a circuit configuration of the ΔΣ modulator 1. FIG. 17 is a diagram showing the configuration of a ΔΣ modulator 1 according to a fourth embodiment of the invention. The ΔΣ modulator 1 according to the fourth embodiment is formed by changing only the configuration of the DC dither circuit 115 in the ΔΣ modulator 1 according to the first embodiment.

As shown in FIG. 17, the analog input signal AIN may be supplied to the ΔΣ modulator 1 through capacitors. The signal line ILp to which the input signal vip is inputted is coupled to one end of a capacitor CPp, and the other end of the capacitor CPp is coupled to the switch element S1p of the gain stage 101. Further, the signal line ILn to which the input signal vin is inputted is coupled to one end of a capacitor CPn, and the other end of the capacitor CPn is coupled to the switch element S1n of the gain stage 101. With this configuration, the input signals vin and vip configuring the analog input signal AIN which is a differential signal are supplied to the ΔΣ modulator 1 through the capacitors CPn and CPp.

The DC dither circuit 115 according to the fourth embodiment is comprised of a resistive divider circuit including resistive elements R1 to R4. The ground voltage AVss is supplied to the coupling point between the resistive elements R1 and R2, and the power supply voltage AVdd is supplied to the coupling point between the resistive elements R3 and R4. The other end of the resistive element R1 is coupled to the other end of the resistive element R3, and the coupling point thereof is coupled to one end of the capacitor CPp and one end of the switch element S1p of the gain stage 101 while the other end of the capacitor CPp is coupled to the signal line ILp and the other end of the switch element S1p is coupled to the capacitor C1p. Further, the other end of the resistive element R2 is coupled to the other end of the resistive element R4, and the coupling point thereof is coupled to one end of the capacitor CPn and one end of the switch element S1n of the gain stage 101 while the other end of the capacitor CPn is coupled to the signal line ILn and the other end of the switch element S1n is coupled to the capacitor C1n.

In the DC dither circuit 115 having such a configuration, a value obtained by subtracting the common voltage VCOM from a voltage at the coupling point between the resistive elements R1 and R3 is the DC signal ddp configuring the DC addition voltage DD which is a differential signal, and a value obtained by subtracting the common voltage VCOM from a voltage at the coupling point between the resistive elements R2 and R4 is the DC signal ddn configuring the DC addition voltage DD. A voltage Vdcp at the coupling point between the resistive elements R1 and R3 is expressed as follows.

$$Vdcp=(R1/(R1+R3))\times Avdd$$

A voltage Vdcn at the coupling point between the resistive elements R2 and R4 is expressed as follows.

$$Vdcn=(R2/(R2+R4))\times Avdd$$

In the ΔΣ modulator 1 according to the first to third embodiments, the difference signal between the signal on the signal line for propagating the analog input signal AIN and the feedback signal FB is obtained, and simultaneously the DC addition voltage DD is superimposed on the difference signal, so that the signal generated by superimposing the DC addition voltage DD on the difference signal between the signal on the signal line for propagating the analog input signal AIN and the feedback signal FB is inputted to the integrating circuit 120.

On the other hand, in the ΔΣ modulator 1 according to the fourth embodiment, firstly the DC addition voltage DD is superimposed on the signal line for propagating the analog input signal AIN, and then the difference signal between the signal on the signal line and the feedback signal FB is obtained, so that the signal generated by superimposing the DC addition voltage DD on the difference signal between the signal on the signal line for propagating the analog input signal AIN and the feedback signal FB is inputted to the integrating circuit 120.

Thus, the DC dither circuit 115 may be any circuit as long as the signal generated by superimposing the DC addition voltage DD on the difference signal between the signal on the signal line for propagating the analog input signal AIN and the feedback signal FB is finally inputted to the integrating circuit 120. That is, the DC dither circuit 115 may be comprised of any circuit as long as it is a circuit for generating the DC addition voltage DD which is superimposed on the difference between the signal on the signal line for propagating the analog input signal AIN and the feedback signal FB.

In order to set the signal level of the DC addition voltage DD in the L channel Lch to be different from the signal level of the DC addition voltage DD in the R channel Rch, at least one of the resistive elements R1 and R3 for generating the DC signal ddp and at least one of the resistive elements R2 and R4 for generating the DC signal ddn are made different between the ΔΣ modulators 1L and 1R.

Fifth Embodiment

Figure 18:
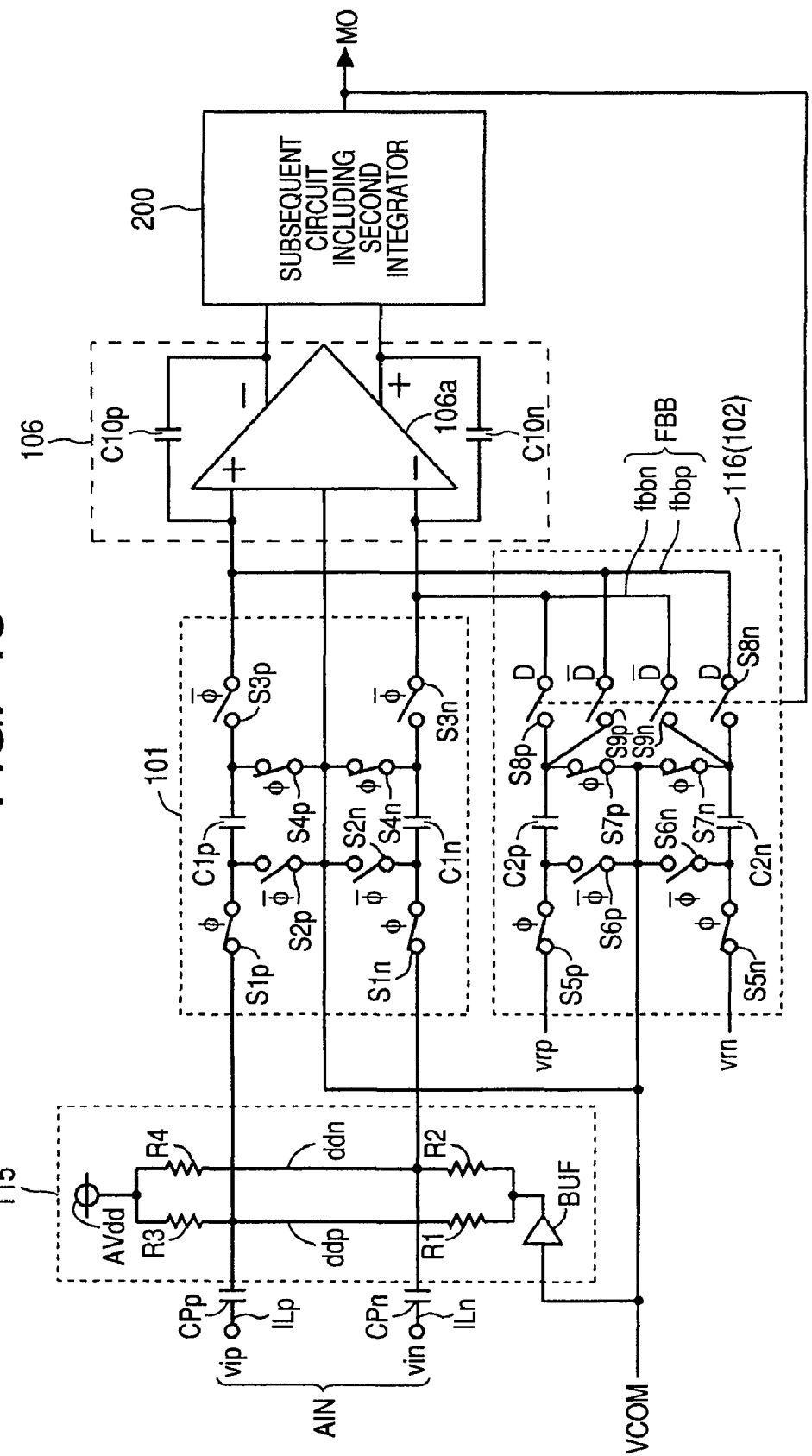
FIG. 18 is a diagram showing the circuit configuration of a ΔΣ modulator according to a fifth embodiment of the invention.

A circuit configuration shown in FIG. 18 may be adopted as a circuit configuration of the ΔΣ modulator 1. FIG. 18 is a diagram showing the configuration of a ΔΣ modulator 1 according to a fifth embodiment of the invention. The ΔΣ modulator 1 according to the fifth embodiment is formed by changing only the configuration of the DC dither circuit 115 in the ΔΣ modulator 1 according to the fourth embodiment.

As shown in FIG. 18, in a DC dither circuit 115 according to the fifth embodiment, instead of the ground voltage AVss, the common voltage VCOM is supplied to the coupling point between the resistive elements R1 and R2 through a buffer circuit BUF. Therefore, the signal level of the DC signal ddp configuring the DC addition voltage DD is a value obtained by subtracting the common voltage VCOM from a voltage obtained by dividing the voltage difference between the power supply voltage AVdd and the common voltage VCOM by the resistive elements R1 and R3, and the signal level of the DC signal ddn configuring the DC addition voltage DD is a value obtained by subtracting the common voltage VCOM from a voltage obtained by dividing the voltage difference between the power supply voltage AVdd and the common voltage VCOM by the resistive elements R2 and R4. The DC dither circuit 115 may have such a circuit configuration.

Sixth Embodiment

As described with reference to FIG. 14, in the case where the frequency of the idle tone in the L channel Lch is different from the frequency of the idle tone in the R channel Rch, even if both the idle tones are combined due to the mutual interference between the channels, the levels of the idle tones in the channels do not increase much.

Accordingly, the DC addition voltage DD may be used in only one of the L channel Lch and the R channel Rch. That is, the DC dither circuit 115 may be provided in only one of the L channel Lch and the R channel Rch. In this case, since the DC addition voltage DD from the channel including the DC dither circuit 115 gets into the other channel due to the mutual interference between the channels, it is possible to shift not only the frequency of the idle tone in the channel including the DC dither circuit 115 but also the frequency of the idle tone in the other channel.

Thus, since the DC addition voltage DD is used in only one of the L channel Lch and the R channel Rch, it is possible to shift the frequencies of the idle tones to a frequency band higher than the desired frequency band in the L channel Lch and the R channel Rch. Therefore, it is possible to suppress the adverse effect of the idle tones in the L channel Lch and the R channel Rch.

Seventh Embodiment

Figure 19:
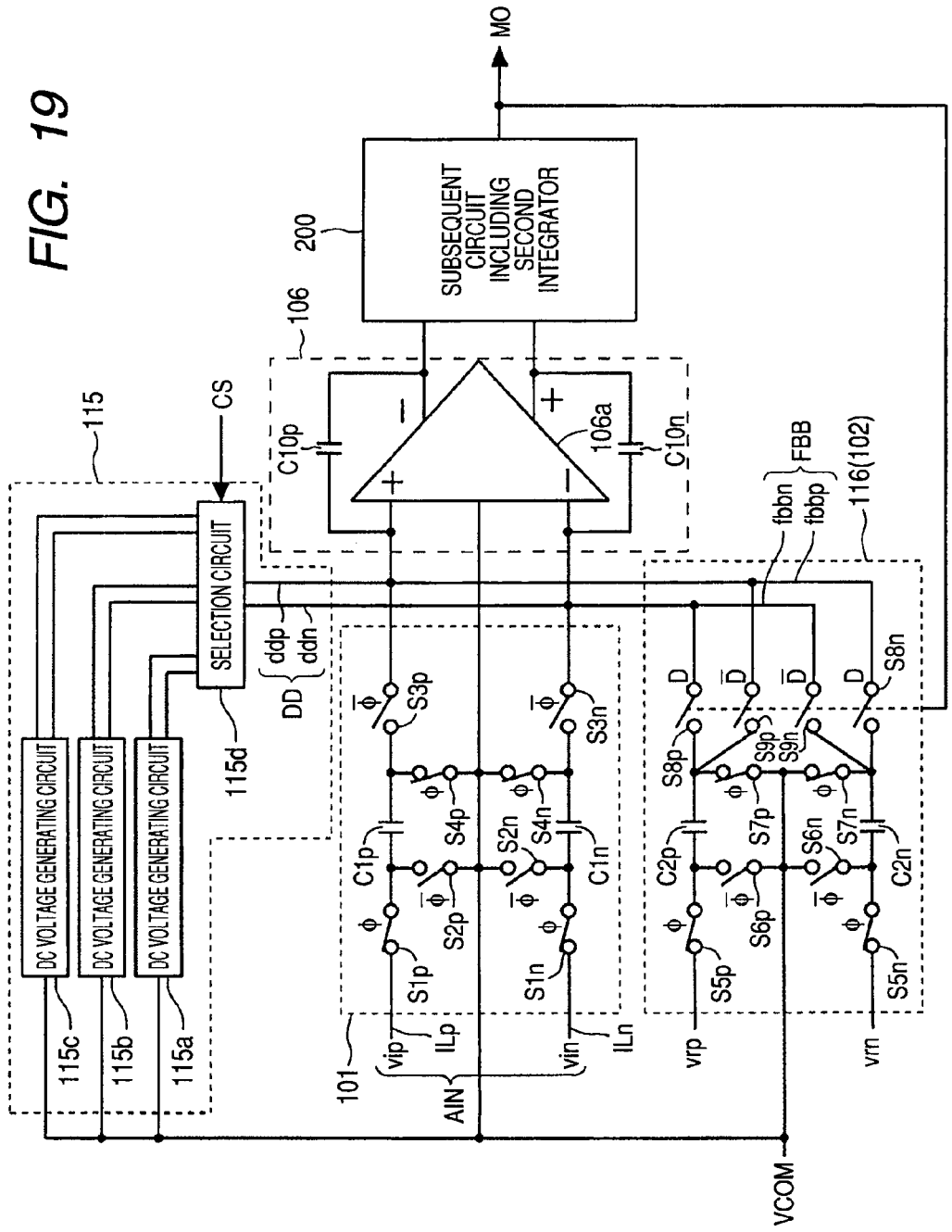
FIG. 19 is a diagram showing the circuit configuration of a ΔΣ modulator according to a seventh embodiment of the invention.

A circuit configuration shown in FIG. 19 may be adopted as a circuit configuration of the ΔΣ modulator 1. FIG. 19 is a diagram showing the configuration of a ΔΣ modulator 1 according to a seventh embodiment of the invention. The ΔΣ modulator 1 according to the seventh embodiment is formed by changing only the configuration of the DC dither circuit 115 in the ΔΣ modulator 1 according to the second embodiment.

As shown in FIG. 19, a DC dither circuit 115 according to the seventh embodiment includes DC voltage generating circuits 115a to 115c for generating mutually different DC voltages and a selection circuit 115d. The respective circuit configurations of the DC voltage generating circuits 115a to 115c are the same as the circuit configuration of the DC dither circuit 115 shown in FIG. 15, and the respective capacitance values of the capacitors C6n and C6p are made different among the DC voltage generating circuits 115a to 115c. Each of the DC voltages outputted from the DC voltage generating circuits 115a to 115c is a differential signal comprised of a pair of DC signals.

The selection circuit 115d selects one of the differential DC voltages outputted from the DC voltage generating circuits 115a to 115c in response to an input control signal CS, and outputs a pair of DC signals configuring the selected DC voltage as the DC signals ddn and ddp.

The DC dither circuit 115 having such a configuration, in response to the input control signal CS, selectively switches among the mutually different DC voltages to generate the DC addition voltage DD. That is, it is possible to switch among the signal levels of the DC addition voltages DD in accordance with the control signal CS. With this, it is possible to easily adjust the frequency shift of the idle tone.

In the case where the DC addition voltage DD is used in both of the L channel Lch and the R channel Rch, each of the DC dither circuits 115 in the L channel Lch and the R channel Rch is the circuit shown in FIG. 19. In the case where the DC addition voltage DD is used in only one of the L channel Lch and the R channel Rch, the DC dither circuit 115 in the one channel is the circuit shown in FIG. 19.

Further, in the case where the DC dither circuit 115 according to the seventh embodiment is adopted in both of the L channel Lch and the R channel Rch, the DC voltages generated by the DC voltage generating circuits 115a to 115c are adjusted so that the DC addition voltages DD outputted from the selection circuits 115d are always made different between the L channel Lch and the R channel Rch.

Further, the DC dither circuits 115 shown in FIGS. 17 and 18 which generate the DC addition voltage DD by the resistive divider circuit, in response to the input control signal, may selectively switch among the mutually different DC voltages to generate the DC addition voltage DD.

What is claimed is:
1. A ΔΣ-type A/D converter comprising:
a first channel for converting a first analog input signal into a digital signal; and
a second channel for converting a second analog input signal into a digital signal,
the first channel including:
  a first quantizer for quantizing a first signal;
  a first dither circuit for generating a first DC addition voltage which is superimposed on a first difference signal which is a difference between a signal on a signal line for propagating the first analog input signal and a first feedback signal obtained by converting an output signal of the first quantizer into an analog signal; and
  a first integrating circuit for integrating the first difference signal having the first DC addition voltage superimposed thereon and outputting a resulting signal as the first signal,
the second channel including:
  a second quantizer for quantizing a second signal;
  a second dither circuit for generating a second DC addition voltage which is different from the first DC addition voltage and is superimposed on a second difference signal which is a difference between a signal on a signal line for propagating the second analog input signal and a second feedback signal obtained by converting an output signal of the second quantizer into an analog signal; and a second integrating circuit for integrating the second difference signal having the second DC addition voltage superimposed thereon and outputting a resulting signal as the second signal.

2. The ΔΣ-type A/D converter according to claim 1, wherein in the first and second dither circuits, switched capacitor circuits generate the first and second DC addition voltages respectively, and capacitance values of capacitors included in the switched capacitor circuits differ from each other so that the first and second DC addition voltages differ from each other.

3. The ΔΣ-type A/D converter according to claim 1, wherein in the first and second dither circuits, resistive divider circuits generate the first and second DC addition voltages respectively, and resistance values of resistive elements included in the resistive divider circuits differ from each other so that the first and second DC addition voltages differ from each other.

4. A ΔΣ-type A/D converter comprising:
   a first channel for converting a first analog input signal into a digital signal; and
   a second channel for converting a second analog input signal into a digital signal,
   the first channel including:
      a first quantizer for quantizing a first signal;
      a dither circuit for generating a DC addition voltage which is superimposed on a first difference signal which is a difference between a signal on a signal line for propagating the first analog input signal and a first feedback signal obtained by converting an output signal of the first quantizer into an analog signal; and
      a first integrating circuit for integrating the first difference signal having the DC addition voltage superimposed thereon and outputting a resulting signal as the first signal,
   the second channel including:
      a second quantizer for quantizing a second signal; and
      a second integrating circuit for integrating a second difference signal which is a difference between a signal on a signal line for propagating the second analog input signal and a second feedback signal obtained by converting an output signal of the second quantizer into an analog signal and outputting a resulting signal as the second signal,
   wherein a DC addition voltage is not superimposed on the second difference signal.

5. The ΔΣ-type A/D converter according to any one of claims 1 to 3,
   wherein the first dither circuit, in response to an input control signal, selectively switches among a plurality of mutually different DC voltages to generate the first DC addition voltage, and
   wherein the second dither circuit, in response to an input control signal, selectively switches among a plurality of mutually different DC voltages to generate the second DC addition voltage.

6. The ΔΣ-type A/D converter according to claim 4, wherein the dither circuit, in response to an input control signal, selectively switches among a plurality of mutually different DC voltages to generate the DC addition voltage.

* * * * *